United States Patent
Togawa et al.

(10) Patent No.: US 9,808,836 B2
(45) Date of Patent: Nov. 7, 2017

(54) SUBSTRATE PROCESSING APPARATUS

(71) Applicant: EBARA CORPORATION, Tokyo (JP)

(72) Inventors: Tetsuji Togawa, Tokyo (JP); Kenya Ito, Tokyo (JP); Yu Ishii, Tokyo (JP); Keisuke Uchiyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 459 days.

(21) Appl. No.: 14/316,709

(22) Filed: Jun. 26, 2014

(65) Prior Publication Data

US 2015/0000055 A1 Jan. 1, 2015

Related U.S. Application Data

(62) Division of application No. 14/315,283, filed on Jun. 25, 2014, now Pat. No. 9,566,616.

(30) Foreign Application Priority Data

Jun. 28, 2013 (JP) .................................. 2013-137541

(51) Int. Cl.
*B08B 1/04* (2006.01)
*H01L 21/304* (2006.01)
(Continued)

(52) U.S. Cl.
CPC ................ *B08B 1/04* (2013.01); *B08B 1/001* (2013.01); *B08B 1/006* (2013.01); *B24B 37/10* (2013.01);
(Continued)

(58) Field of Classification Search
CPC ........... B08B 1/00; B08B 1/001; B08B 1/002; B08B 1/008; B08B 1/04; B08B 11/00; B08B 11/0204; B08B 13/00; B24B 37/00; B24B 37/04; B24B 37/07; B24B 37/10; B24B 37/105; B24B 37/107; B24B 37/27; B24B 37/28; B24B 37/30; B24B 37/32;
(Continued)

(56) References Cited

U.S. PATENT DOCUMENTS 5,966,766 A * 10/1999 Shipley ............. H01L 21/67046
15/102
6,175,983 B1 * 1/2001 Hirose .................... B08B 1/007
15/102
(Continued)

FOREIGN PATENT DOCUMENTS

EP         845328     *  6/1998
JP         60-143634  *  7/1985
(Continued)

*Primary Examiner* — Mark Spisich
(74) *Attorney, Agent, or Firm* — Baker & Hostetler LLP

(57) ABSTRACT

There is disclosed a substrate processing apparatus which is capable of detecting whether a substrate, such as a wafer, supported by a fluid is properly present in a predetermined processing position or not. The substrate processing apparatus includes at least one distance sensor configured to measure a distance between a scrubber and a hydrostatic support structure; and a processing controller configured to calculate a gap between the hydrostatic support structure and the surface of the substrate from a measured value of the distance and determine whether the gap falls within a predetermined range or not.

8 Claims, 31 Drawing Sheets

(51) Int. Cl.
*H01L 21/687* (2006.01)
*B24B 37/10* (2012.01)
*B24B 37/30* (2012.01)
*B08B 1/00* (2006.01)
*H01L 21/67* (2006.01)

(52) U.S. Cl.
CPC ............ *B24B 37/107* (2013.01); *B24B 37/30* (2013.01); *H01L 21/304* (2013.01); *H01L 21/67046* (2013.01); *H01L 21/67051* (2013.01); *H01L 21/687* (2013.01); *H01L 21/68728* (2013.01)

(58) Field of Classification Search
CPC ......... H01L 21/02041; H01L 21/02096; H01L 21/302; H01L 21/304; H01L 21/463; H01L 21/67; H01L 21/67046; H01L 21/67092; H01L 21/673; H01L 21/683; H01L 21/6835; H01L 21/687
USPC ............. 15/21.1, 77, 88.2, 102, 230, 230.18
See application file for complete search history.

(56) References Cited

U.S. PATENT DOCUMENTS

| | | | |
|---|---|---|---|
| 6,412,134 B1 * | 7/2002 | Oikawa | B08B 1/04 15/102 |
| 6,432,212 B1 | 8/2002 | Hirose et al. | |
| 6,594,848 B1 * | 7/2003 | Lee | B08B 1/04 15/102 |
| 6,629,538 B2 * | 10/2003 | Yokogawa | B08B 1/00 134/1.2 |
| 7,984,526 B2 * | 7/2011 | Benson | A46B 13/008 134/902 |
| 2002/0074016 A1 * | 6/2002 | Crevasse | B08B 1/04 134/2 |
| 2003/0041878 A1 | 3/2003 | Shimada et al. | |
| 2013/0152971 A1 | 6/2013 | Kato | |
| 2013/0213437 A1 | 8/2013 | Ishii et al. | |

FOREIGN PATENT DOCUMENTS

| | | | |
|---|---|---|---|
| JP | 63-251166 | * | 10/1988 |
| JP | 5-36658 | * | 2/1993 |
| JP | 06-084858 A | | 3/1994 |
| JP | 07-111255 | | 4/1995 |
| JP | 09-92633 | | 4/1997 |
| JP | 10-44029 | * | 2/1998 |
| JP | 11-260783 A | | 9/1999 |
| JP | 11-265846 | * | 9/1999 |
| JP | 2000-117200 A | | 4/2000 |
| JP | 2001-54853 | * | 2/2001 |
| JP | 2002-246346 | * | 8/2002 |
| JP | 2003-86566 | * | 3/2003 |
| JP | 2003-109926 | * | 4/2003 |
| JP | 2005-525244 A | | 8/2005 |
| JP | 2006-237098 | | 9/2006 |
| JP | 2006-261393 A | | 9/2006 |
| JP | 2010-109225 | * | 5/2010 |
| JP | 2010-278103 A | | 12/2010 |
| JP | 2011-125959 | * | 6/2011 |
| WO | WO 99/41022 A1 | | 8/1999 |
| WO | WO 03/074228 A1 | | 9/2003 |

* cited by examiner

SUBSTRATE PROCESSING APPARATUS

CROSS REFERENCE TO RELATED APPLICATION

This application is a divisional of U.S. patent application Ser. No. 14/315,283, filed Jun. 25, 2014, now U.S. Pat. No. 9,566,616 which claims priority to Japanese Patent Application No. 2013-137541 filed Jun. 28, 2013, the entire contents of which are hereby incorporated by reference.

BACKGROUND

In recent years, various devices including memory circuits, logic circuits, and image sensors (e.g., complimentary metal-oxide-semiconductor (CMOS) sensors) have become more and more highly integrated. In the processes of fabricating these devices, foreign matters, such as fine particles and dusts, may be attached to the devices. The foreign matters attached to the devices could be a cause of a short circuit between interconnects and a malfunction of the circuit. Therefore, in order to increase reliability of the devices, it is necessary to clean a wafer on which the devices are fabricated so as to remove the foreign matters from the wafer.

The foreign matters, such as fine particles and dusts, may also be attached to a backside surface of the wafer, i.e., a bare silicon surface. The foreign matters on the backside surface of the wafer may cause the wafer to be separated from a stage reference surface of an exposure apparatus and/or may cause the wafer surface to tilt with respect to the stage reference surface, resulting in a patterning shift or a focal length error. In order to prevent such problems, it is necessary to remove the foreign matters from the backside surface of the wafer as well.

There has recently been developed a patterning apparatus using nanoimprint technology, other than the optical exposure technology. In this nanoimprint technology, a mold, which has predefined interconnect patterns, is pressed against a resin material formed on a wafer to transfer the interconnect patterns to the resin material. In such nanoimprint technology, it is required to remove the foreign matters existing on the surface of the wafer in order to avoid transfer of unwanted spots between the mold and the wafer and also between wafers.

Heretofore, it has been customary to scrub a wafer with a pen-shaped brush or a sponge roll while rotating the wafer about its own axis. However, these conventional cleaning techniques have a low foreign matter removal ratio and particularly have found it difficult to remove foreign matters having a size of 100 nm or larger.

SUMMARY OF THE INVENTION

Under the above-described circumstances, there has been proposed a substrate processing apparatus for slightly scraping a surface of a wafer by placing a scrubbing member in sliding contact with the wafer under a high load while supporting a lower surface of the wafer with a high-pressure fluid. Embodiments, which will be described below, propose improvements of a substrate processing apparatus having such a static-pressure supporting mechanism.

A first object is to provide a substrate processing apparatus which is capable of detecting whether a substrate, such as a wafer, supported by a fluid is properly present in a predetermined processing position or not.

A second object is to provide a substrate processing apparatus which is capable of determining an amount of decrease in thickness of a substrate, such as a wafer, which has been scraped by a scrubbing member.

A third object is to provide a substrate processing apparatus which is capable of controlling a profile of a substrate, such as a wafer, which is supported by a fluid.

A fourth object is to provide a substrate processing apparatus which is capable of uniformly processing a surface of a substrate, such as a wafer, which is supported by a fluid.

Embodiments described below relate to an apparatus for processing a front surface and/or a back surface of a substrate, such as a wafer, which requires a high level of cleanliness.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface; a hydrostatic support structure configured to support the second surface of the substrate via fluid without contacting the substrate; at least one distance sensor configured to measure a distance between the scrubber and the hydrostatic support structure; and a processing controller configured to calculate a gap between the hydrostatic support structure and the second surface of the substrate from a measured value of the distance and determine whether the gap falls within a predetermined range or not.

In an embodiment, the processing controller is configured to subtract a present measured value of the distance from an initial measured value of the distance to determine an amount of decrease in a thickness of the substrate that has been processed by the scrubbing member.

In an embodiment, the at least one distance sensor comprises a plurality of distance sensors arrayed along a radial direction of the substrate, and the processing controller is configured to calculate gaps between the hydrostatic support structure and the second surface of the substrate from measured values of the distance obtained by the distance sensors, determine whether the calculated gaps fall in the predetermined range or not, and subtract present measured values of the distance from corresponding initial measured values of the distance, respectively, to obtain a distribution of amounts of decrease in a thickness of the substrate that has been processed by the scrubbing member.

In an embodiment, the at least one distance sensor comprises a distance sensor movable along a radial direction of the substrate, and the processing controller is configured to calculate gaps between the hydrostatic support structure and the second surface of the substrate from measured values of the distance obtained at measuring points by the distance sensor, determine whether the calculated gaps fall in the predetermined range or not, and subtract present measured values of the distance from corresponding initial measured values of the distance, respectively, to obtain a distribution of amounts of decrease in a thickness of the substrate that has been processed by the scrubbing member.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface; a hydrostatic support structure configured to support the second surface of the substrate via fluid without contacting the substrate; at least one distance sensor configured to measure a distance between the scrubber and the hydrostatic support structure; and a processing controller configured to subtract a present measured value of the distance from an initial measured value of the distance to determine an amount of decrease in a thickness of the substrate that has been processed by the scrubbing member.

In an embodiment, the processing controller is configured to calculate a gap between the hydrostatic support structure and the second surface of the substrate from a measured value of the distance and determine whether the calculated gap falls within a predetermined range or not.

In an embodiment, the at least one distance sensor comprises a plurality of distance sensors arrayed along a radial direction of the substrate; and the processing controller is configured to subtract present measured values of the distance from corresponding initial measured values of the distance, respectively, which are obtained at measuring points by the distance sensors to obtain a distribution of amounts of decrease in the thickness of the substrate that has been processed by the scrubbing member.

In an embodiment, the at least one distance sensor comprises a distance sensor movable along a radial direction of the substrate; and the processing controller is configured to subtract present measured values of the distance from corresponding initial measured values of the distance, respectively, which are obtained by the distance sensor to obtain a distribution of amounts of decrease in the thickness of the substrate that has been processed by the scrubbing member.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface; a hydrostatic support structure having a substrate support surface configured to support the second surface of the substrate via fluid without contacting the substrate, the hydrostatic support structure having fluid discharge ports which are open in the substrate support surface; distance sensors each configured to measure a distance between the substrate and the hydrostatic support structure; and a processing controller configured to determine whether measured values of the distance obtained by the distance sensors fall within a predetermined range or not.

In an embodiment, the distance sensors comprise at least three distance sensors.

In an embodiment, the at least three distance sensors are arranged at equal angular intervals around a predetermined central point.

In an embodiment, the processing controller is configured to detect a point of time when the scrubbing member is brought into contact with the first surface of the substrate based on a change in the measured values of the distance.

In an embodiment, the substrate processing apparatus further comprises: flow-rate regulating valves configured to regulate flow rates of the fluid to be supplied to the fluid discharge ports, wherein the processing controller is configured to control operations of the flow-rate regulating valves based on the measured values of the distance obtained by the distance sensors.

In an embodiment, there is provided a substrate processing apparatus for processing a substrate having a first surface and a second surface, the second surface being an opposite surface of the first surface, the substrate processing apparatus comprising a scrubber configured to place a scrubbing member in sliding contact with the first surface of the substrate to process the first surface; a hydrostatic support structure having a substrate support surface configured to support the second surface of the substrate via fluid without contacting the substrate, the hydrostatic support structure having fluid discharge ports which are open in the substrate support surface; film thickness sensors each configured to measure a film thickness of the substrate, the film thickness sensors being disposed so as to face the fluid discharge ports, respectively; flow-rate regulating valves configured to regulate flow rates of the fluid to be supplied to the fluid discharge ports; and a processing controller configured to control operations of the flow-rate regulating valves based on measured values of the film thickness obtained by the film thickness sensors.

In an embodiment, the film thickness sensors are mounted to the scrubber.

In an embodiment, the fluid discharge ports are arrayed along a radial direction of the substrate supported by the hydrostatic support structure.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface, the scrubber having a deformable elastic member supporting the scrubbing member; and a hydrostatic support structure configured to support the second surface of the substrate via fluid without contacting the substrate.

In an embodiment, the elastic member comprises a plurality of elastic members.

In an embodiment, the scrubber has a hard member which is harder than the elastic member, and the elastic member is fixed to the hard member.

In an embodiment, the scrubber has a hard member which is harder than the elastic member, and the hard member is disposed between the elastic member and the scrubbing member.

In an embodiment, the elastic member comprises an air bag filled with a gas.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface; a hydrostatic support structure configured to support the second surface of the substrate via fluid without contacting the substrate, and a spherical bearing configured to allow the scrubbing member to tilt.

In an embodiment, the spherical bearing is configured to support the scrubber while allowing the scrubber in its entirety to tilt.

In an embodiment, the spherical bearing is configured to support the scrubbing member while allowing the scrubbing member to tilt.

In an embodiment, there is provided a substrate processing apparatus for processing a substrate having a first surface and a second surface, the second surface being an opposite surface of the first surface, the substrate processing apparatus comprising: a scrubber configured to place a scrubbing member in sliding contact with the first surface of the substrate to process the first surface; and a hydrostatic support structure configured to support the second surface of the substrate via fluid without contacting the substrate, wherein the scrubber includes a pressing plate having a substrate contact surface lying parallel to the first surface of the substrate supported by the hydrostatic support structure, and the substrate contact surface of the pressing plate is shaped so as to surround a substrate contact surface of the scrubbing member.

In an embodiment, the substrate contact surface of the pressing plate comprises a soft pad.

In an embodiment, the scrubber further includes a relatively moving mechanism configured to move the pressing plate relative to the scrubbing member in directions toward and away from the first surface of the substrate.

The embodiments described above offer the following advantages:

(i) It is determined whether the gap or distance between the substrate and the hydrostatic support structure falls within the predetermined range or not. The gap or distance between the substrate and the hydrostatic support structure represents the position of the substrate that is supported by the fluid. It is thus possible to determine whether the substrate is present in a predetermined processing position or not based on the determination as to whether the gap or distance falls within the predetermined range.

(ii) The amount of decrease in the thickness of the substrate can be determined from a change in the distance between the scrubber and the hydrostatic support structure.

(iii) A contact pressure between the substrate and the scrubbing member can be controlled by the operations of the flow-rate regulating valves. Consequently, the substrate can have its profile controlled.

(iv) The surface of the substrate can be processed uniformly by making the scrubbing member responsive to bending of the substrate under the pressure of the fluid or pressing the substrate so as to render it flat.

DETAILED DESCRIPTION OF EMBODIMENTS

Embodiments will be described below with reference to the drawings.

Figure 1:
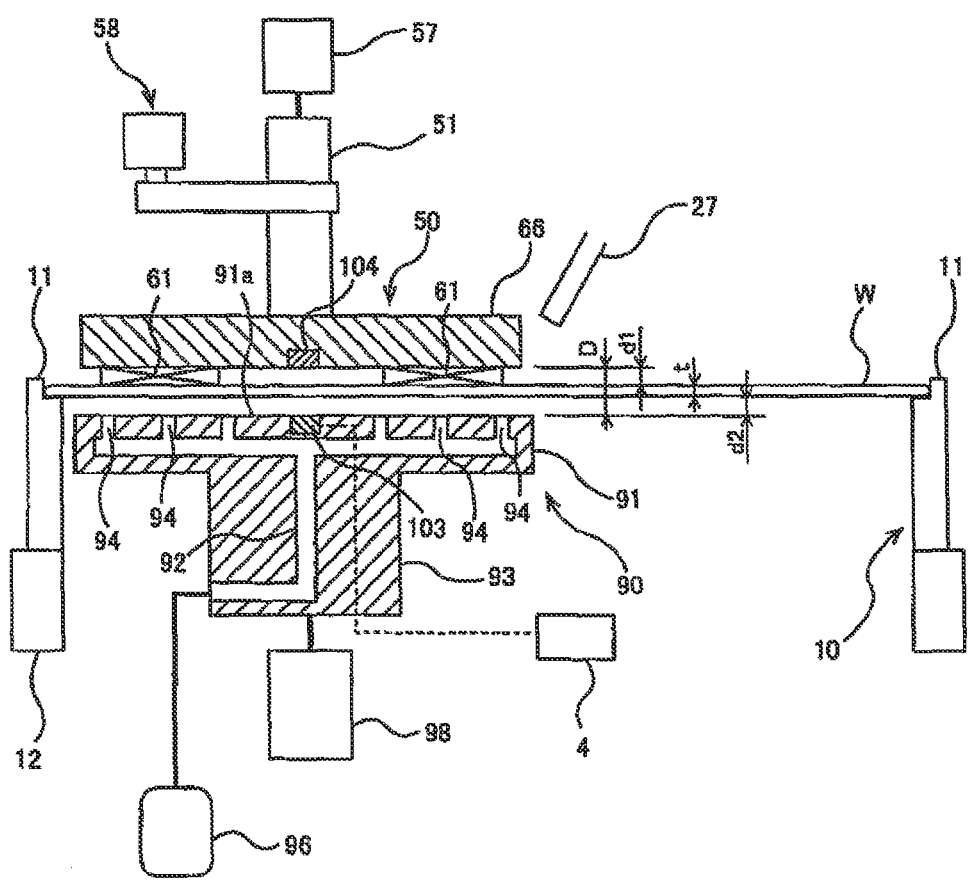
FIG. 1 is a schematic view of a substrate processing apparatus according to an embodiment.

FIG. 1 is a schematic view of a substrate processing apparatus according to an embodiment. The substrate processing apparatus includes a substrate rotating mechanism 10 for holding a substrate W, such as a wafer, in a horizontal position and rotating the substrate W about its central axis, a scrubber (or a processing head) 50 for scrubbing an upper surface (a first surface) of the substrate W held by the substrate rotating mechanism 10 to remove foreign matters and scratches from the upper surface of the substrate W, and a hydrostatic support structure (or hydrostatic support device) 90 for supporting a lower surface (a second surface) of the substrate W with a high-pressure fluid without contacting the substrate W. The scrubber 50 is disposed at the upper side of the substrate W held by the substrate rotating mechanism 10, and the hydrostatic support structure 90 is disposed below the substrate W held by the substrate rotating mechanism 10.

In one example, the upper surface (or the first surface) of the substrate W is a back surface with no devices formed thereon, and the lower surface (or the second surface) of the substrate W is a front surface with devices formed thereon. In another example, the upper surface (or the first surface) of the substrate W is a front surface with devices formed thereon, and the lower surface (or the second surface) of the substrate W is a back surface with no devices formed thereon. An example of the surface with no devices may be a silicon surface.

The substrate rotating mechanism 10 includes a plurality of chucks 11 for gripping a peripheral edge of the substrate W and a hollow motor 12 for rotating the substrate W through the chucks 11. The substrate W is held in a horizontal position by the chucks 11 and rotated about the axis thereof by the hollow motor 12. A cleaning liquid supply nozzle 27 for supplying a cleaning liquid (for example, pure water) onto the upper surface of the substrate W is disposed above the substrate W. The cleaning liquid supply nozzle 27 is coupled to a cleaning liquid supply source, not shown, which supplies the cleaning liquid through the cleaning liquid supply nozzle 27 onto the upper surface of the substrate W.

The scrubber 50 is coupled to a scrubber shaft 51. The scrubber shaft 51 is coupled to a scrubber rotating mechanism 58 for rotating the scrubber 50 about its central axis. An air cylinder 57 that serves as a load exerting device for exerting a downward load on the scrubber 50 is coupled to the scrubber shaft 51. The scrubber 50 includes a plurality of scrubbing members 61 made of a soft material (e.g., sponge, nonwoven fabric, foamed polyurethane), a cleaning tape, or a polishing tape, for processing the surface of the substrate W, and a disk-shaped holder 66 for holding the scrubbing members 61.

Figure 2:
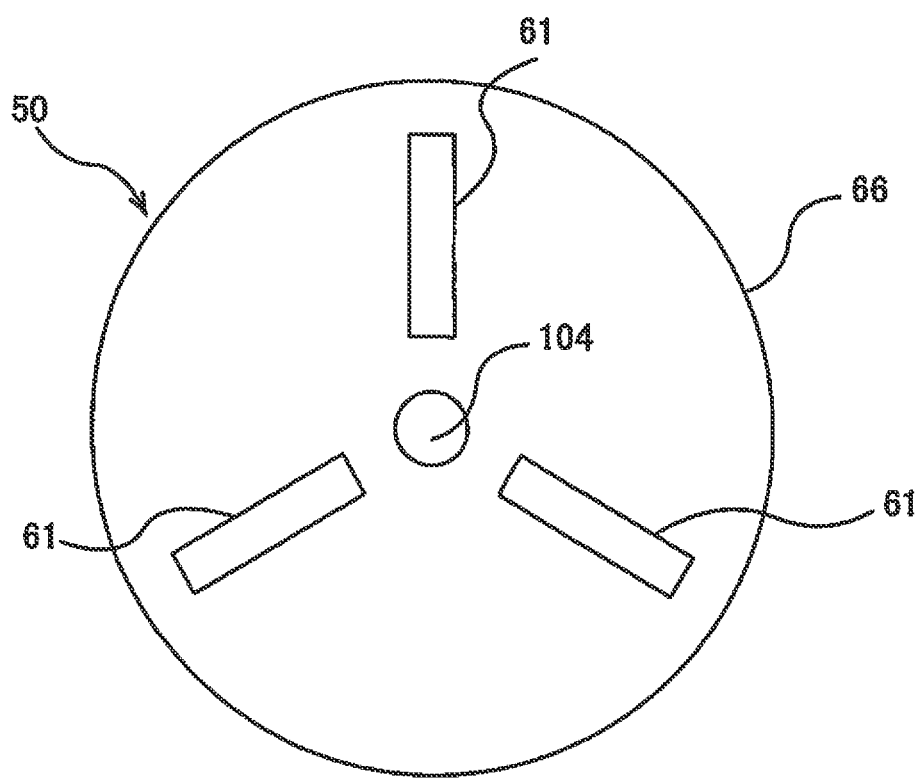
FIG. 2 is a bottom view of a scrubber.
Figure 3:
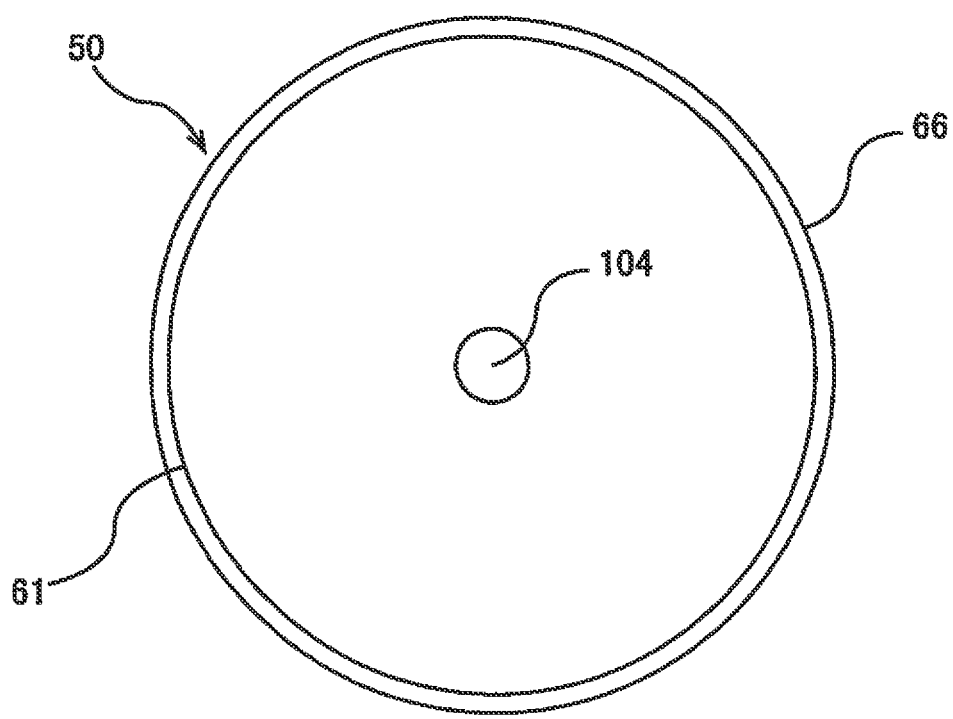
FIG. 3 is a bottom view of another example of the scrubber.

FIG. 2 is a bottom view of the scrubber 50. As shown in FIG. 2, the scrubbing members 61 extend in radial directions of the scrubber 50 and are disposed at equal angular intervals around the center of the scrubber 50. Alternatively, as shown in FIG. 3, the scrubber 50 may have a single disk-shaped scrubbing member 61.

While the scrubber 50 is being rotated by the scrubber rotating mechanism 58, the scrubber 50 is pressed against the upper surface of the substrate W by the air cylinder 57. The upper surface of the substrate W is supplied with the cleaning liquid from the cleaning liquid supply nozzle 27, and the scrubbing members 61 are held in sliding contact with the upper surface of the substrate W in the presence of the cleaning liquid, thereby processing the surface of the substrate W. The processing of the surface of the substrate W using the scrubbing members 61 is a process of slightly scraping away the surface of the substrate W to remove foreign matters from the surface of the substrate W and/or to remove at least a part of a material which constitutes the surface of the substrate W. The processing of the surface of the substrate W using the scrubbing members 61 will hereinafter be referred to as a scrubbing process.

The hydrostatic support structure 90 includes a support stage 91 having a substrate support surface 91*a* with a plurality of fluid discharge ports 94 defined therein, a fluid supply passage 92 coupled to the fluid discharge ports 94, and a support shaft 93 supporting the support stage 91. The fluid supply passage 92 extends through the support shaft 93 and is coupled to a fluid supply source 96. According to the present embodiment, the substrate support surface 91*a* is of a circular shape. However, the substrate support surface 91*a* may be of a quadrangular shape or other shape.

The support stage 91 is disposed below the substrate W that is held by the substrate rotating mechanism 10, and the fluid discharge ports 94 are disposed so as to face the lower surface of the substrate W. The support shaft 93 has a lower end coupled to a stage elevating device 98. The stage elevating device 98 is configured to elevate the support stage 91 to a position at which the substrate support surface (i.e., upper surface) 91*a* of the support stage 91 is close to the lower surface of the substrate W.

Figure 4:
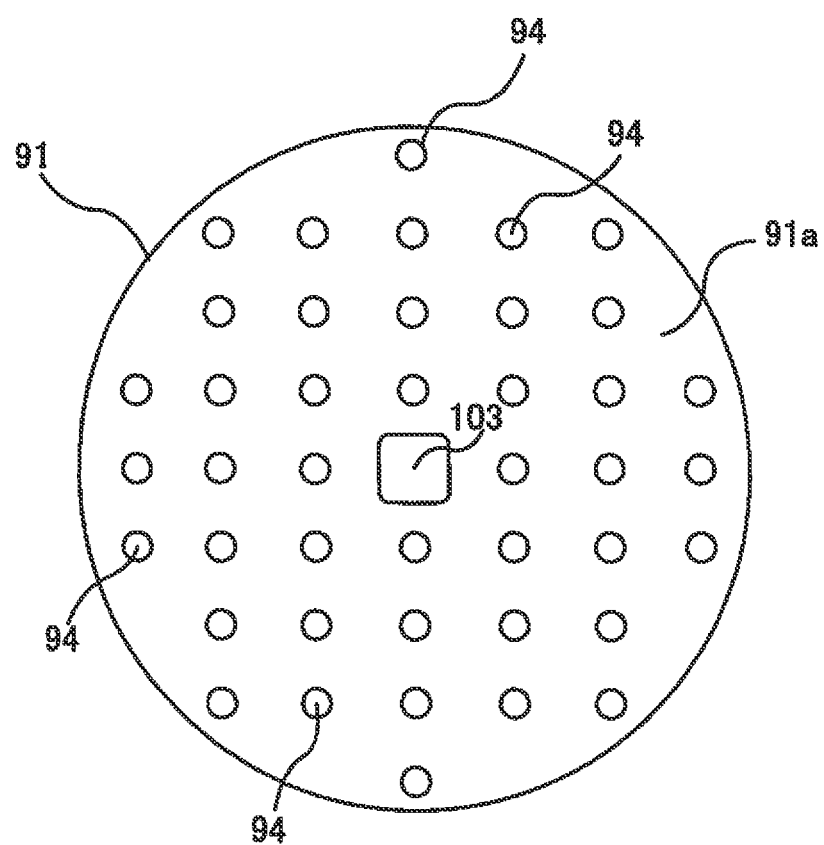
FIG. 4 is a top view of a support stage.

FIG. 4 is a top view of the support stage 91. As shown in FIG. 4, the fluid discharge ports 94 are open in the substrate support surface 91*a* that constitutes the upper surface of the support stage 91, and are distributed over the substrate support surface 91*a* in its entirety. A pressurized fluid is supplied continuously from the fluid supply source 96 through the fluid supply passage 92 to the fluid discharge ports 94. The fluid overflows the fluid discharge ports 94 and flows through a gap between the lower surface of the substrate W and the substrate support surface 91*a* of the support stage 91. The gap between the substrate W and the support stage 91 is filled with the fluid, which supports the substrate W. The substrate W and the support stage 91 are kept out of contact with each other, with the gap therebetween in the range of 50 μm to 500 μm. Since the hydrostatic support structure 90 using the fluid can support the substrate W without contacting the substrate W, the hydrostatic support structure 90 can prevent damage to the devices fabricated on the lower surface of the substrate W.

Figure 5:
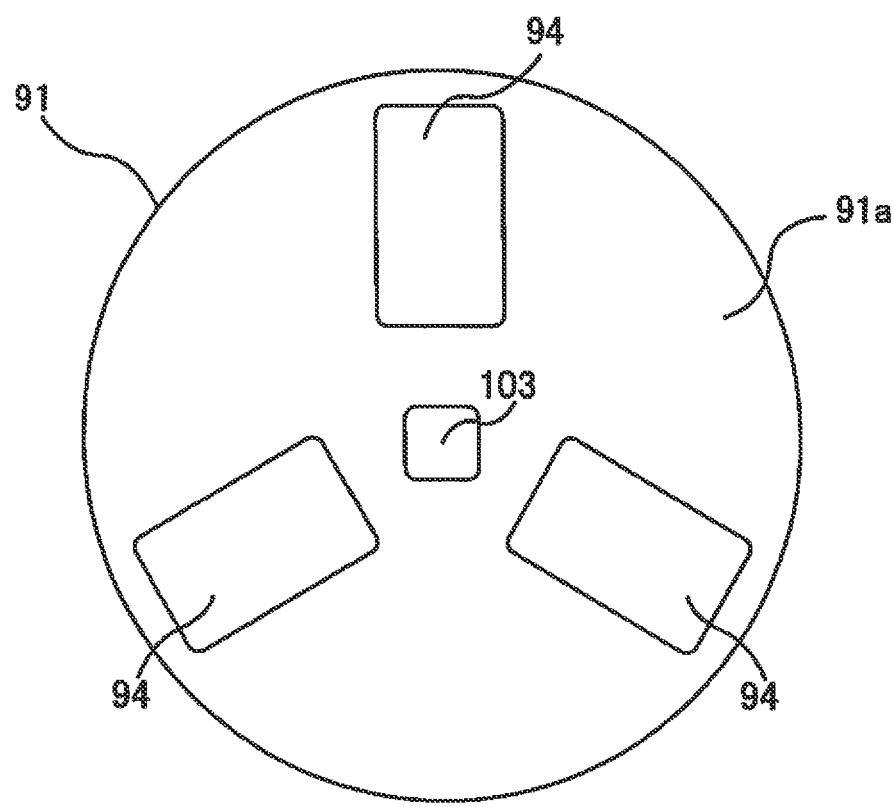
FIG. 5 is a top view of another example of the support stage.

In the example shown in FIG. 4, the support stage 91 has a number of fluid discharge ports 94 defined therein. However, the present invention is not limited to this example. As shown in FIG. 5, the support stage 91 may have three or more recesses as fluid discharge ports 94 at equal angular intervals around the center of the substrate support surface 91*a*. The recesses as the fluid discharge ports 94 are supplied with the fluid from the fluid supply passage 92. The fluid that is used in the hydrostatic support structure 90 may comprise a liquid such as pure water which is an incompressible fluid or a gas which is a compressible fluid such as air, nitrogen, or the like.

When the scrubber 50 is rotating, the lower surfaces (i.e., substrate contact surfaces) of the scrubbing members 61 provide a circular scrubbing surface for scrubbing the upper surface of the substrate W that is held by the substrate rotating mechanism 10. The scrubbing surface of the scrubber 50 and the substrate support surface 91*a* of the hydrostatic support structure 90 are disposed symmetrically with respect to the substrate W. Specifically, the scrubbing surface of the scrubber 50 and the substrate support surface 91*a* of the hydrostatic support structure 90 are disposed such that the substrate W is interposed therebetween. The load exerted from the scrubber 50 on the substrate W is borne by the hydrostatic support structure 90 from right below the scrubber 50 (i.e., from the opposite side of the scrubber 50). Therefore, the scrubber 50 is able to apply a large load to the upper surface of the substrate W.

As shown in FIG. 1, the scrubbing surface and the substrate support surface 91*a* are arranged concentrically. The scrubber 50 may preferably be disposed such that an edge of the scrubbing surface is located on the center of the substrate W. The diameter of the scrubbing surface may preferably be the same as or slightly smaller than the radius of the substrate W. In this embodiment, the diameter of the substrate support surface 91a is larger than the diameter of the scrubbing surface, while in another embodiment the diameter of the substrate support surface 91a may be the same as or smaller than the diameter of the scrubbing surface.

As shown in FIG. 1, at least one distance sensor 103 for measuring a distance between the scrubber 50 and the hydrostatic support structure 90 is embedded in the support stage 91. The scrubber 50 is provided with a sensor target 104 mounted thereto. The distance sensor 103 is disposed at the center of the substrate support surface 91a, while the sensor target 104 is disposed at the center of the scrubber 50. The distance sensor 103 has an upper end lying flush with or located slightly below the substrate support surface 91a. The distance sensor 103 is configured to sense the sensor target 104 to thereby measure the distance between the sensor target 104 and the distance sensor 103, i.e., the distance between the scrubber 50 and the hydrostatic support structure 90. The distance sensor 103 may be a non-contact-type distance sensor, such as an eddy-current sensor or a laser displacement meter.

A measured value of the distance obtained by the distance sensor 103 is sent to a processing controller 4. This processing controller 4 calculates the gap between the substrate support surface 91a of the hydrostatic support structure 90 and the lower surface of the substrate W from the measured value of the distance. As shown in FIG. 1, where a distance between the sensor target 104 and the distance sensor 103 is represented by D, a distance between the sensor target 104 and the upper surface of the substrate W when the scrubber 50 is in contact with the substrate W is represented by d1, a thickness of the substrate W is represented by t, and a gap between the substrate support surface 91a and the lower surface of the substrate W is represented by d2, the gap d2 can be determined by subtracting the distance d1 and the thickness t of the substrate W from the distance D (d2=D−d1−t). The distance d1 is a fixed value depending on the relative position of the sensor target 104 and the scrubbing members 61. The distance d1 and the thickness t of the substrate W are stored in advance in the processing controller 4. Because an amount of decrease in the thickness t of the substrate W as a result of the scrubbing process is extremely small compared with the gap d2, this amount of decrease in the thickness t of the substrate W is negligible in the calculation of the gap d2.

The hydrostatic support structure 90 supports the substrate W with the high-pressure fluid. Therefore, the substrate W may be displaced or deformed, or may be cracked. In some cases, the substrate W itself may jump out of the substrate rotating mechanism 10. In view of this, the processing controller 4 is configured to monitor or determine whether the gap d2 is kept within a predetermined range or not during the scrubbing process and determine whether the substrate W is properly supported by the fluid or not, i.e., whether the substrate W is present in a predetermined processing position or not. The predetermined range of the gap d1 is stored in advance in the processing controller 4. This predetermined range of the gap d2 represents an appropriate range of the gap d2 which indicates that the substrate W is present in the predetermined processing position. If the substrate W is inclined or cracked, for example, the gap d2 is expected to go beyond the appropriate range. Furthermore, if the scrubber 50 is not in its predetermined scrubbing position, the gap d2 is also expected to go beyond the appropriate range.

The processing controller 4 determines whether the calculated gap d2 falls within the predetermined range or not. If the gap d2 does not fall in the predetermined range, then the processing controller 4 generates an alarm signal. The processing controller 4 calculates an amount of material of the substrate W removed by the scrubber 50, i.e., an amount of decrease in the thickness of the substrate W, from a change in the measured value of the distance D with respect to time. Specifically, the processing controller 4 subtracts a present measured value of the distance from an initial measured value of the distance to thereby obtain the amount of the material of the substrate W that has been removed by the scrubbing members 61, i.e., an amount of decrease in the thickness of the substrate W. If the amount of the material of the substrate W removed by the scrubbing members 61, i.e., the amount of decrease in the thickness of the substrate W, reaches a predetermined threshold value, the processing controller 4 generates a surface processing end signal and sends the generated surface processing end signal to the exterior.

Figure 6:
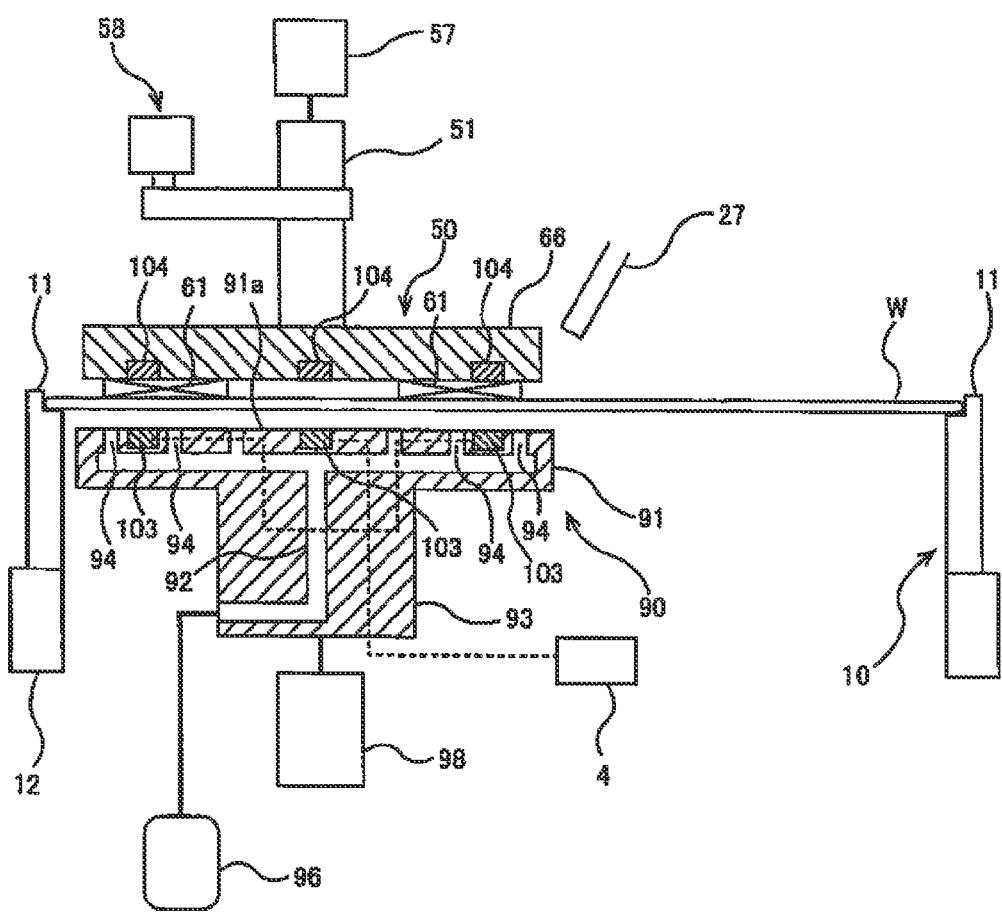
FIG. 6 is a view showing an example in which a plurality of distance sensors and a plurality of sensor targets are provided.

In another embodiment, as shown in FIG. 6, the substrate processing apparatus may include a plurality of distance sensors 103 and a plurality of corresponding sensor targets 104. The distance sensors 103 are arrayed along a radial direction of the substrate W, and the sensor targets 104 are disposed in facing relation to the respective distance sensors 103. The processing controller 4 calculates a plurality of gaps between the substrate support surface 91a of the hydrostatic support structure 90 and the lower surface of the substrate W from a plurality of measured values of the distance obtained by the distance sensors 103. If at least one of the calculated gaps does not fall within the appropriate range referred to above, then the processing controller 4 judges that the substrate W is not present in the predetermined processing position. Furthermore, the processing controller 4 subtracts a plurality of present measured values of the distance respectively from a plurality of corresponding initial measured values of the distance to obtain a distribution of amounts of the material of the substrate W removed by the scrubbing members 61, i.e., a distribution of amounts of decrease in the thickness of the substrate W. The distribution of the removal amounts of the material of the substrate W obtained in this manner represents a profile of the substrate W.

Figure 7A:
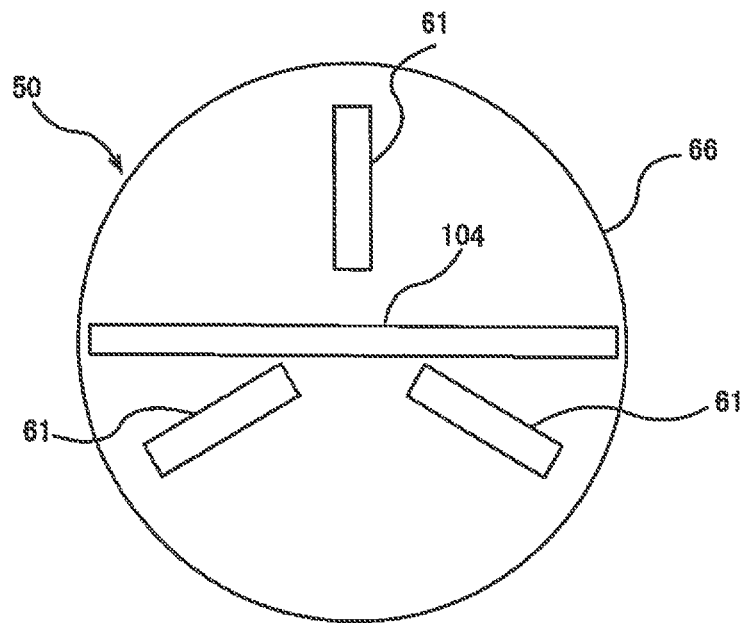
FIG. 7A is a bottom view of the scrubber having a sensor target extending in a diametrical direction of the scrubber.
Figure 7B:
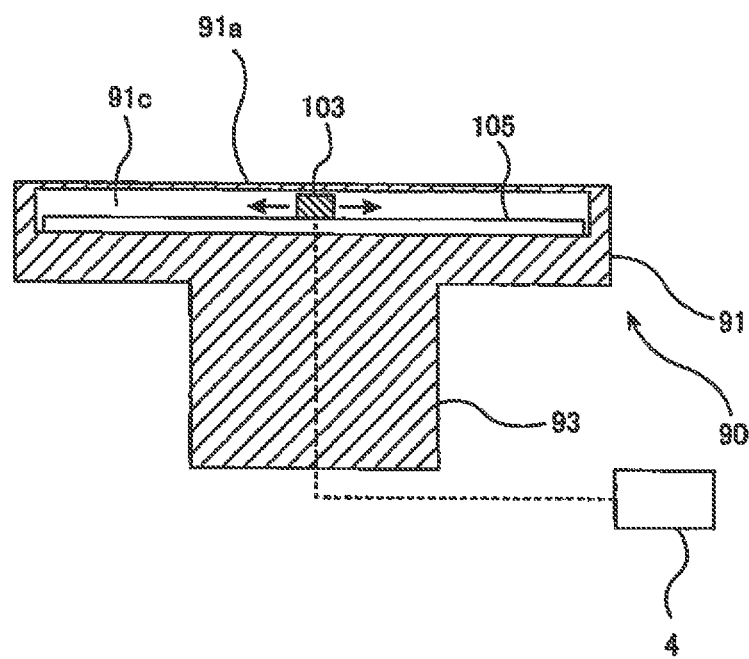
FIG. 7B is a cross-sectional view of a hydrostatic support structure provided with a distance sensor movable in a radial direction of a substrate.

In still another embodiment, as shown in FIGS. 7A and 7B, a distance sensor 103, which is movable in the radial direction of the substrate W, may be disposed in the support stage 91, and a sensor target 104 extending in the diametrical direction of the scrubber 50 may be mounted to the scrubber 50. The distance sensor 103 and the sensor target 104 are disposed so as to face each other. The processing controller 4 calculates a plurality of gaps between the substrate support surface 91a of the hydrostatic support structure 90 and the lower surface of the substrate W from a plurality of measured values of the distance obtained at a plurality of measuring points by the distance sensor 103. If at least one of the calculated gaps does not fall in the appropriate range referred to above, then the processing controller 4 judges that the substrate W is not present in the predetermined processing position. Furthermore, the processing controller 4 subtracts a plurality of present measured values of the distance from a plurality of corresponding initial measured values of the distance to obtain a distribution of amounts of the material of the substrate W removed by the scrubbing members 61.

In the example shown in FIG. 7B, the support stage 91 has a space 91c formed therein, and the distance sensor 103 and a sensor moving device 105 are disposed in the space 91*c*. The sensor moving device 105 is configured to move the distance sensor 103 in the radial direction of the substrate W.

Figure 8:
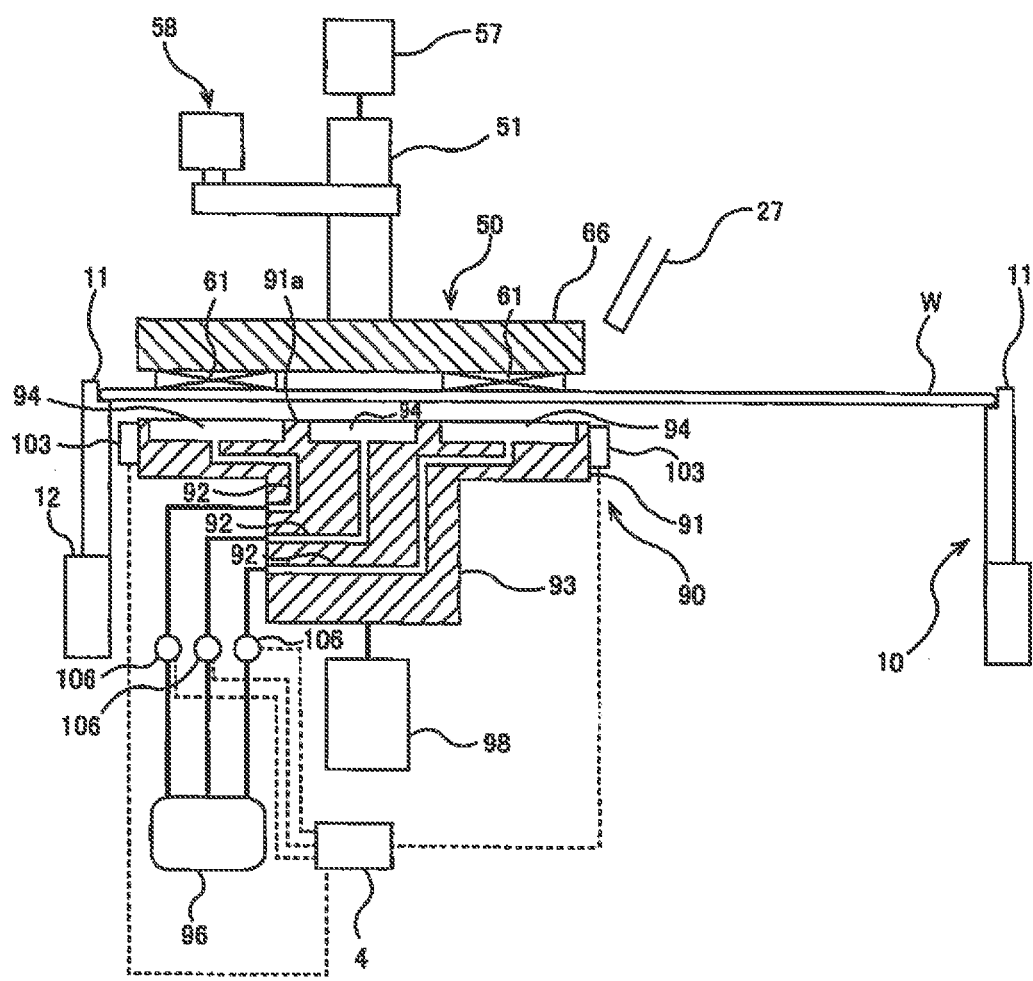
FIG. 8 is a schematic view of a substrate processing apparatus according to another embodiment.
Figure 9:
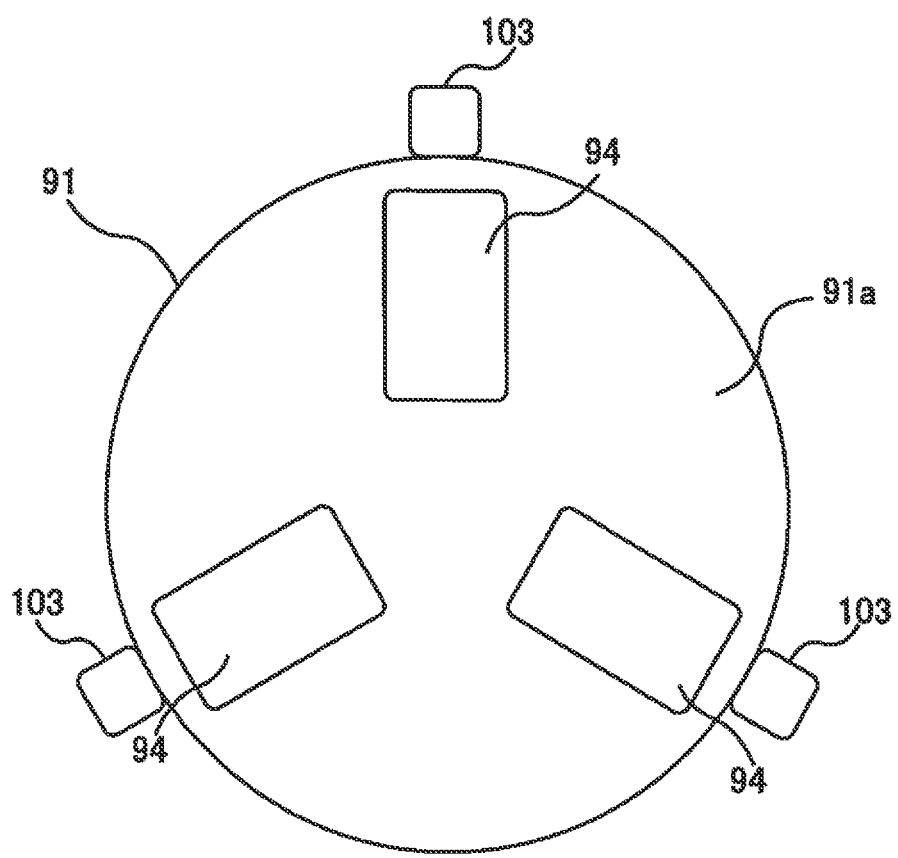
FIG. 9 is a top view of a support stage shown in FIG. 8.

FIG. 8 is a schematic view of the substrate processing apparatus according to another embodiment, and FIG. 9 is a top view of the support stage 91 shown in FIG. 8. Structural and operational details of the present embodiment which will not be described below are identical to those of the embodiment shown in FIG. 1, and their repetitive description will be omitted.

A plurality of (three in FIG. 9) distance sensors 103 are mounted to the support stage 91. Each of these distance sensors 103 is configured to measure the distance between the hydrostatic support structure 90 and the substrate W. The distance sensors 103 are arranged at equal angular intervals around the center of the substrate support surface 91*a* of the support stage 91. Measured values of the distance obtained by the distance sensors 103 are sent to the processing controller 4. Each of the distance sensors 103 may be a non-contact type distance sensor, such as a laser distance sensor. As shown in FIG. 9, the support stage 91 has three fluid discharge ports 94 defined therein adjacent respectively to the three distance sensors 103. The three distance sensors 103 are adjacent to the three fluid discharge ports 94, respectively, and located outwardly of the three fluid discharge ports 94.

The fluid discharge ports 94 are in fluid communication with three fluid supply passages 92, respectively, and are supplied with the pressurized fluid through the fluid supply passages 92. The fluid supply passages 92 are provided with flow-rate regulating valves 106, respectively, which regulate flow rates of the fluid flowing through the fluid supply passages 92.

Figure 10:
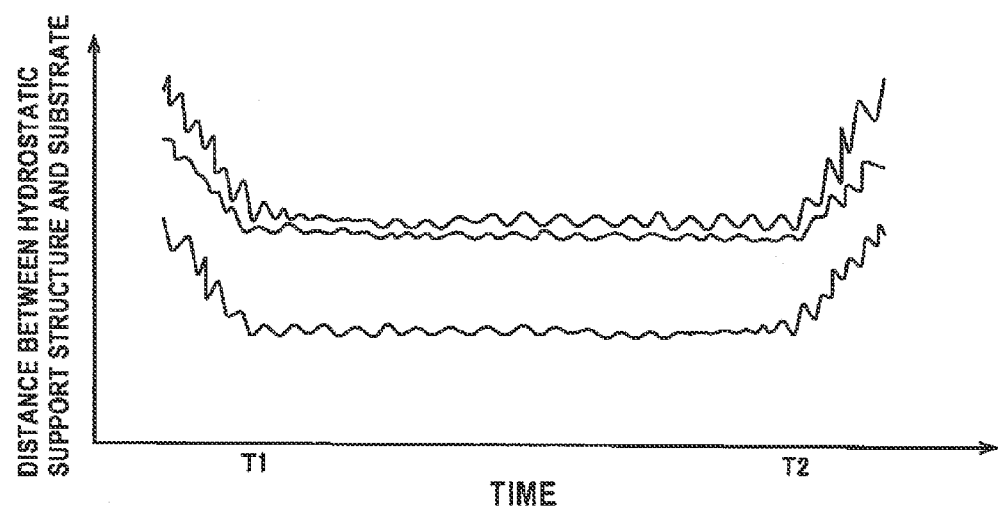
FIG. 10 is a graph showing measured values of a distance output from three distance sensors.

Operations of the flow-rate regulating valves 106 are controlled by the processing controller 4. Specifically, the processing controller 4 controls the operations of the flow-rate regulating valves 106 based on the measured values of the distance obtained by the distance sensors 103. For example, as shown in FIG. 10, if one of the three distance sensors 103 produces a smaller measured value of the distance than that of the other distance sensors 103, the processing controller 4 operates the corresponding flow-rate regulating valve 106 so as to increase the flow rate of the fluid flowing into the fluid discharge port 94 located adjacent to the distance sensor 103 that is producing the smaller measured value of the distance. With use of three or more distance sensors 103, the processing controller 4 is able to determine whether the substrate W is supported horizontally or not from the measured values of the distance, and to control the flow-rate regulating valves 106 so as to keep the substrate W in a horizontal position.

In FIG. 10, a time T1 indicates a point of time when the scrubber 50 contacts the substrate W, and a time T2 indicates a point of time when the scrubber 50 is separated from the substrate W. When the scrubber 50 contacts the substrate W, the substrate W is depressed. As a result, the measured value of the distance changes largely, as can be seen from FIG. 10. While the scrubber 50 is held in contact with the substrate W, the measured value of the distance is approximately constant. The processing controller 4 is configured to detect a point of time when the scrubbing members 61 of the scrubber 50 are brought into contact with the upper surface of the substrate W based on a change in the measured value of the distance.

The number and arrangement of the distance sensors 103, the fluid discharge ports 94, the fluid supply passages 92, and the flow-rate regulating valves 106 are not limited to those of the present embodiment. The substrate processing apparatus may have four or more distance sensors 103, for example.

Figure 11:
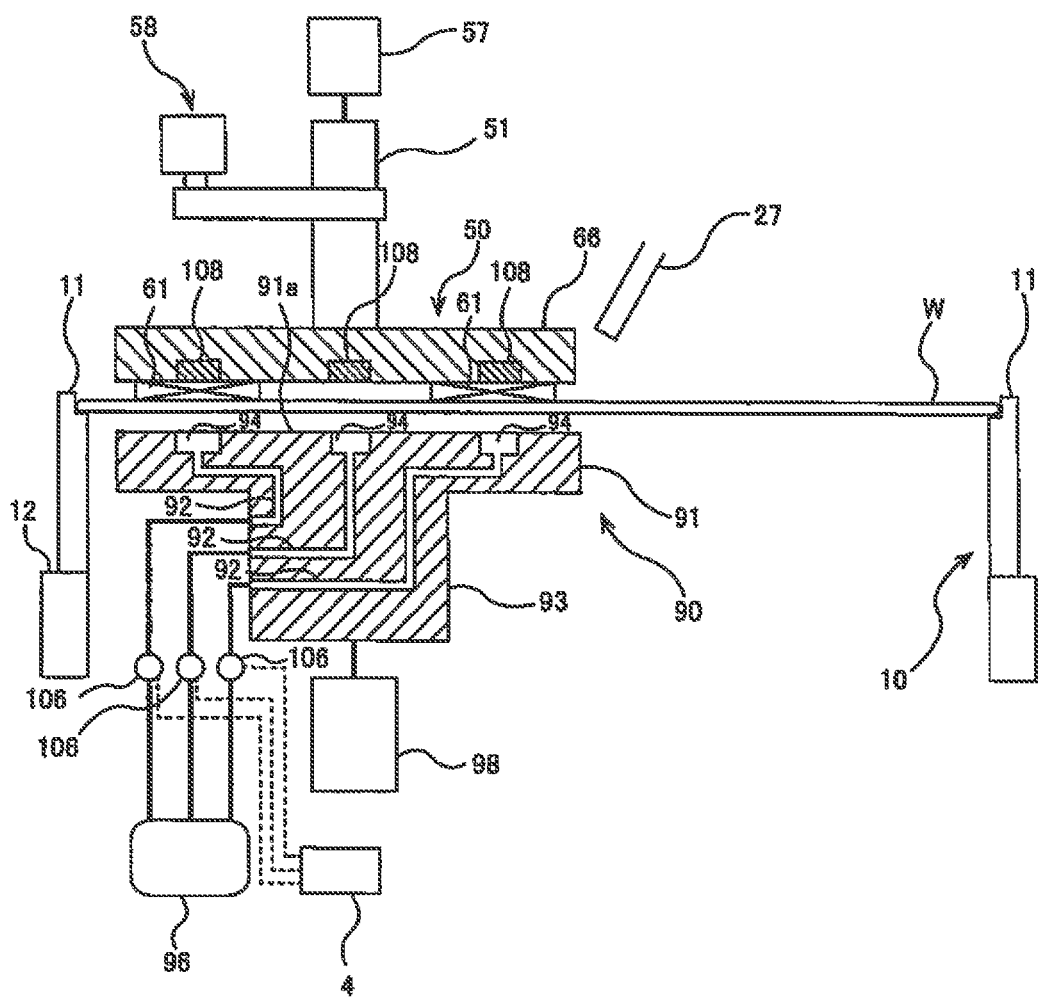
FIG. 11 is a schematic view of a substrate processing apparatus according to still another embodiment.

FIG. 11 is a schematic view of a substrate processing apparatus according to still another embodiment. Structural and operational details of the present embodiment which will not be described below are identical to those of the embodiment shown in FIG. 1, and their repetitive description will be omitted.

Figure 12:
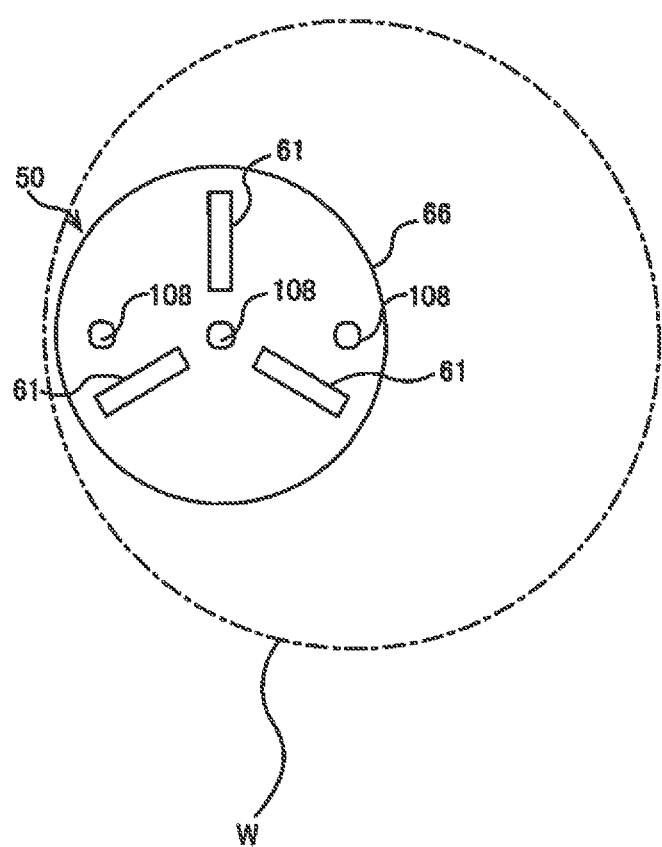
FIG. 12 is a top view showing positions of film thickness sensors when measuring a film thickness.

As shown in FIG. 11, the scrubber 50 is provided with a plurality of (three in FIG. 11) film thickness sensors 108. These film thickness sensors 108 are arrayed along the diametrical direction of the scrubber 50. Each film thickness sensor 108 is configured to measure a thickness of the substrate W without contacting the substrate W. Each of the film thickness sensors 108 may be an optical film thickness sensor or an eddy-current film thickness sensor. Measured values of the film thickness obtained by the film thickness sensors 108 are sent to the processing controller 4. When the film thickness sensors 108 measure the film thickness, the scrubber 50 is fixed in its orientation such that the film thickness sensors 108 are arrayed along the radial direction of the substrate W, as shown in FIG. 12.

The support stage 91 has three fluid discharge ports 94 defined therein in alignment with the three film thickness sensors 108, respectively. The fluid discharge ports 94 are arrayed along the radial direction of the substrate W. The three fluid discharge ports 94 are in fluid communication with three fluid supply passages 92, respectively, and are supplied with the pressurized fluid through the fluid supply passages 92. The fluid supply passages 92 are provided with flow-rate regulating valves 106, respectively, which regulate flow rates of the fluid flowing through the fluid supply passages 92.

Operations of the flow-rate regulating valves 106 are controlled by the processing controller 4. Specifically, the processing controller 4 controls the operations of the flow-rate regulating valves 106 based on the measured values of the film thickness obtained by the film thickness sensors 108. For example, if one of the three film thickness sensors 108 produces a larger measured value of the film thickness than that of the other film thickness sensors 108, the processing controller 4 operates the corresponding flow-rate regulating valve 106 so as to increase the flow rate of the fluid flowing into the fluid discharge port 94 corresponding to the film thickness sensor 108 that is producing the larger measured value of the film thickness. When the flow rate of the fluid increases, a region of the substrate W facing that fluid discharge port 94 is locally raised, resulting in a partial increase in contact pressure between the scrubbing members 61 and the substrate W. Therefore, the scrubber 50 can scrape a larger amount of the material off the region of the substrate W than the other region. In this manner, the processing controller 4 is able to control the profile of the substrate W based on the measured values of the film thickness.

The number and arrangement of the film thickness sensors 108, the fluid discharge ports 94, the fluid supply passages 92, and the flow-rate regulating valves 106 are not limited to those according to the present embodiment. The substrate processing apparatus may have four or more film thickness sensors 108, for example.

Figure 13:
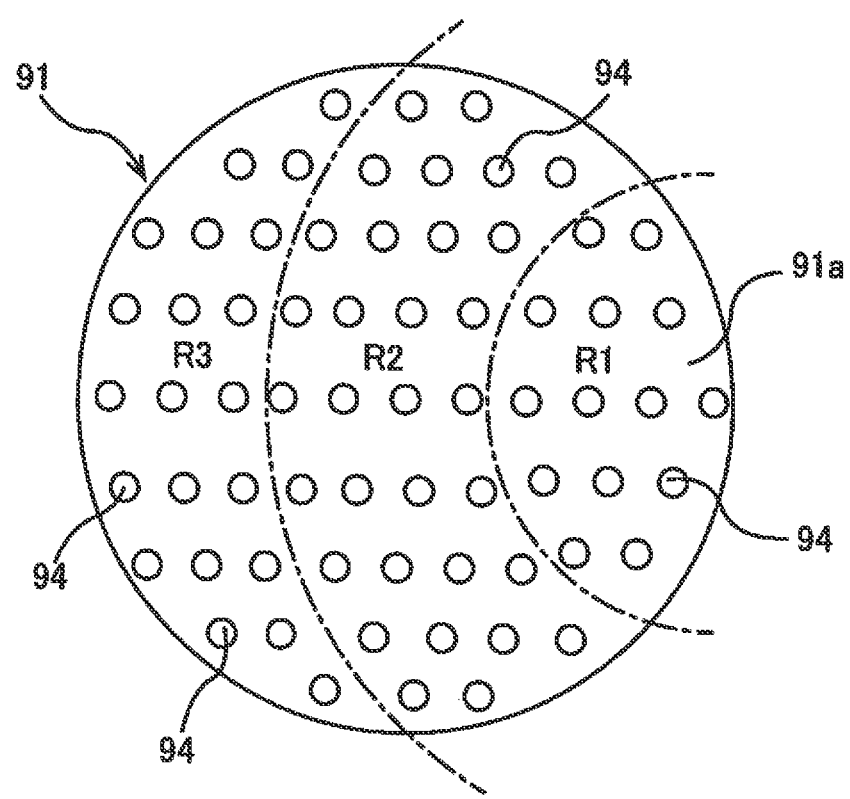
FIG. 13 is a plan view showing a modification of the support stage of the hydrostatic support structure.

FIG. 13 is a plan view showing a modification of the support stage 91 of the hydrostatic support structure 90. A plurality of regions (three regions R1, R2, R3 in FIG. 13) are pre-defined on the substrate support surface 91*a* of the support stage 91. At least one of the number, position, and size of the fluid discharge ports 94 is different from region to region. Therefore, the static pressure of the fluid that is developed between the substrate W and the substrate support surface 91a is different from region to region. The number, position, and/or size of the fluid discharge ports 94 is determined from a profile of a test substrate, i.e., a film thickness distribution of the test substrate which is obtained by scrubbing the test substrate under a constant static pressure.

Figure 14:
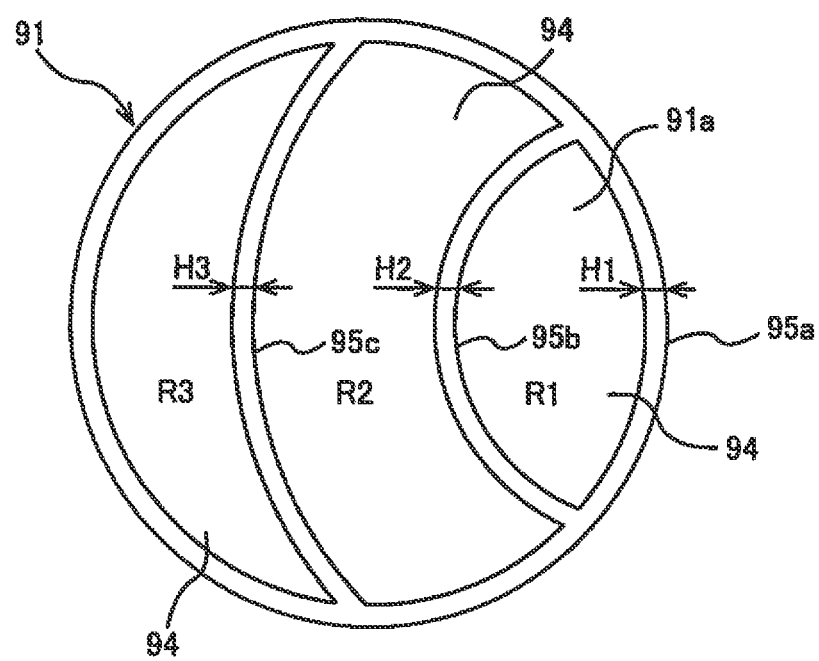
FIG. 14 is a plan view showing another modification of the support stage of the hydrostatic support structure.

FIG. 14 is a plan view showing another modification of the support stage 91 of the hydrostatic support structure 90. A plurality of regions (three regions R1, R2, R3 in FIG. 14) are pre-defined on the substrate support surface 91a of the support stage 91. Each of the regions has a recess as a fluid discharge port 94. According to the present modification, three recesses (three fluid discharge ports) 94 are defined in the respective three regions R1, R2, R3. The shape and/or size of the recess 94 is different from region to region. Therefore, the static pressure of the fluid that is developed between the substrate W and the substrate support surface 91a is different from region to region. The shapes and sizes of the recesses 94 vary depending on thicknesses H1, H2, H3 of a surrounding wall 95a and/or partition walls 95b, 95c which define the recesses 94.

In the case where the support stages 91 shown in FIGS. 13 and 14 are used, the flow rates of the fluid supplied to the respective regions of the substrate support surface 91a may not positively be controlled.

Figure 15:
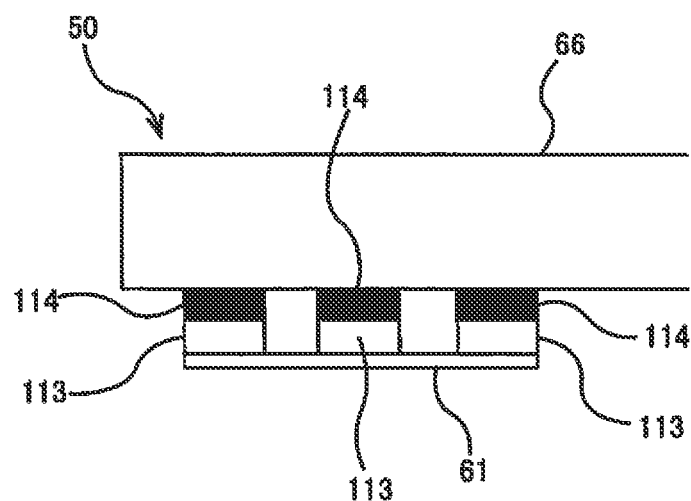
FIG. 15 is a schematic view showing another example of the scrubber applicable to the above embodiments.
Figure 16:
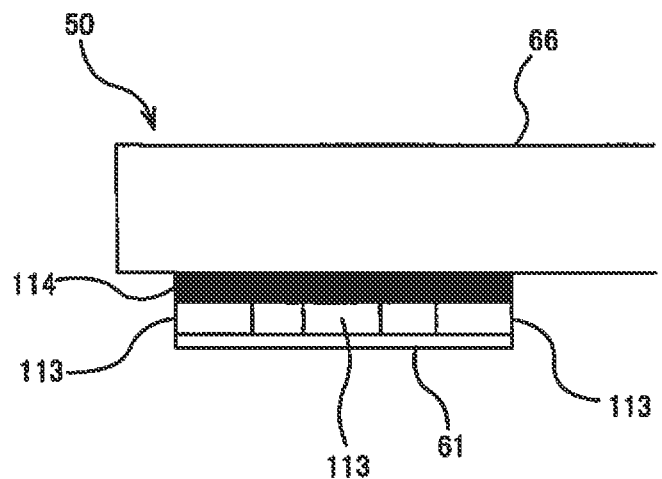
FIG. 16 is a view showing an example in which a plurality of elastic members are fixed to a common hard member.
Figure 17:
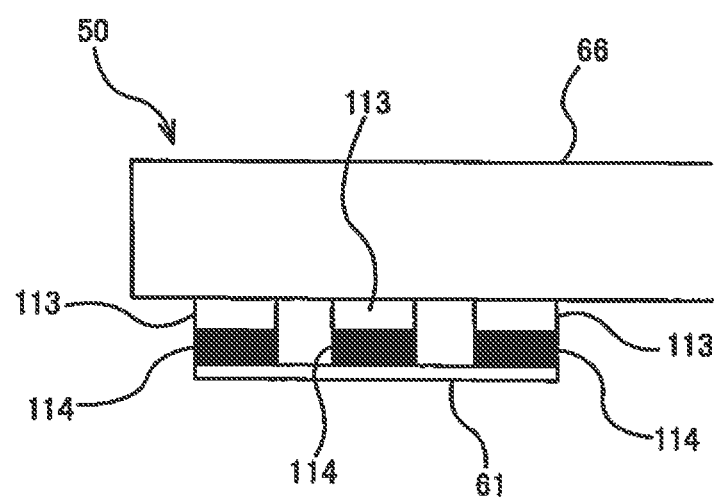
FIG. 17 is a view showing an example in which a scrubbing member is supported by elastic members through hard members.

FIG. 15 is a schematic view showing another example of the scrubber 50 applicable to the above embodiments. FIG. 15 shows only a part of the scrubber 50. The scrubber 50 has a plurality of deformable elastic members 113 for pressing the scrubbing member (e.g., a soft tape made of nonwoven fabric) 61 against the upper surface of the substrate W. The scrubbing member 61 is supported by the elastic members 113, which are fixed to hard members 114, respectively. As shown in FIG. 16, the elastic members 113 may be fixed to a common hard member 114. As shown in FIG. 17, hard members 114 may be disposed between the elastic members 113 and the scrubbing member 61. In FIG. 17, the scrubbing member 61 is supported by the elastic members 113 through the hard members 114.

When the scrubbing process is being performed, the substrate W may be bent under the pressure of the pressurized fluid. The elastic members 113 allow the scrubbing member 61 to be deformed along the surface of the substrate W, so that the scrubbing member 61 can press the substrate W with a uniform load.

Figure 18:
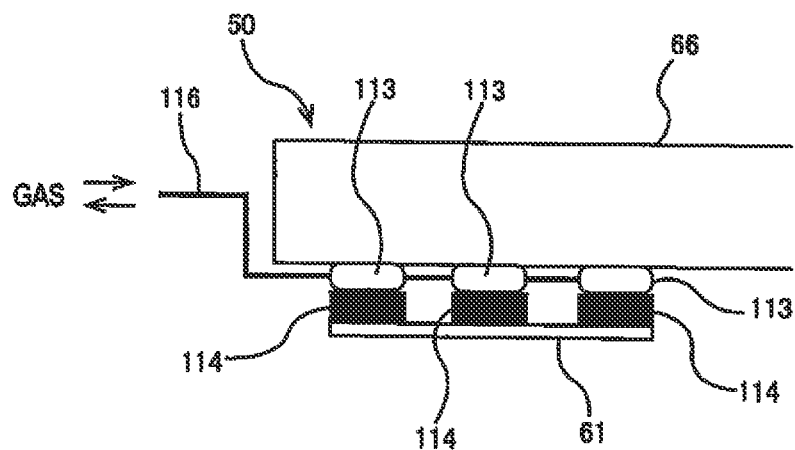
FIG. 18 is a view showing an example in which air bags are used as the elastic members.

The elastic members 113 may be made of urethane sponge or may comprise air bags filled with a gas. The hard members 114 are made of a material harder than the elastic members 113, e.g., a thermosetting resin. FIG. 18 shows an example in which the air bags are used as the elastic members 113. Each of the air bags 113 is filled with a gas, such as air, an inert gas, or the like. A pressure regulating line 116 may be coupled to the air bags 113 for regulating the pressure of the gas in the air bags 113 so as to adjust the pressing force of the scrubbing member 61.

Figure 19:
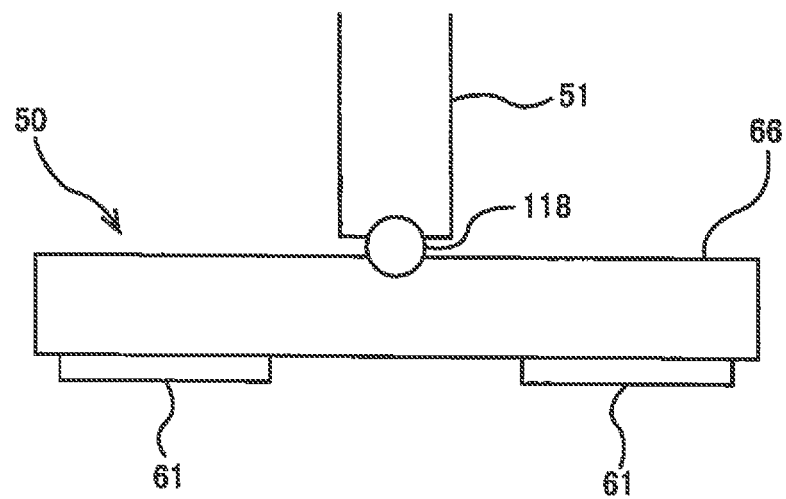
FIG. 19 is a schematic view showing still another example of the scrubber.
Figure 20:
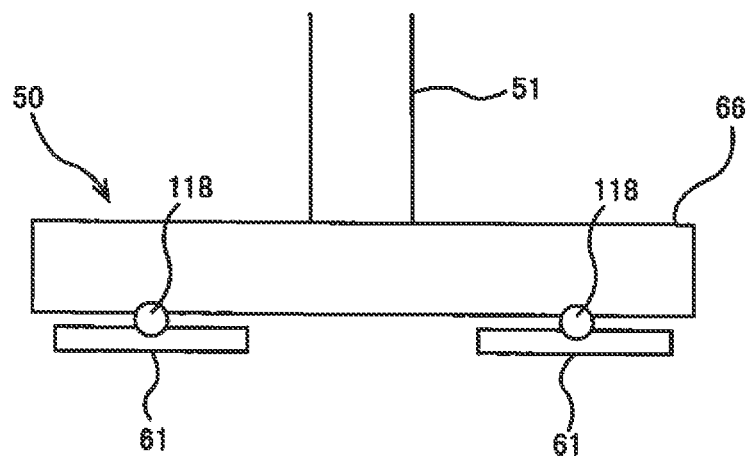
FIG. 20 is a schematic view showing yet another example of the scrubber.

FIG. 19 is a schematic view showing still another example of the scrubber 50. As shown in FIG. 19, a spherical bearing 118 is disposed between the scrubber 50 and the scrubber shaft 51. The spherical bearing 118 is configured to allow the scrubber 50 in its entirety to tilt with respect to the scrubber shaft 51. Therefore, the scrubbing members 61 can tilt in response to bending of the substrate W and hence can press the substrate W at a uniform load. In an example shown in FIG. 20, spherical bearings 118 are disposed between the scrubbing members 61 and the holder 66. In this example also, the scrubbing members 61 can tilt in response to bending of the substrate W.

Figure 21:
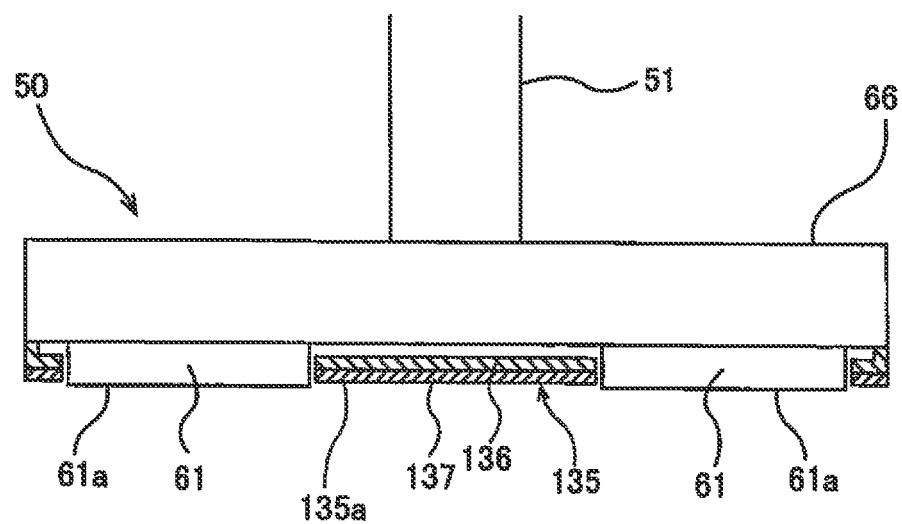
FIG. 21 is a schematic view showing still yet another example of the scrubber.

FIG. 21 is a schematic view showing still yet another example of the scrubber 50. As shown in FIG. 21, the scrubber 50 has a pressing plate 135 having a substrate contact surface 135a that lies parallel to the upper surface of the substrate W supported by the hydrostatic support structure 90. The pressing plate 135 is fixed to the lower surface of the holder 66. The pressing plate 135 includes a hard flat plate 136 and a soft pad 137 attached to a lower surface of the flat plate 136. The substrate contact surface 135a of the pressing plate 135 is shaped so as to surround substrate contact surfaces 61a of the scrubbing members 61. The substrate contact surface 135a is constituted by the soft pad 137. The substrate contact surface 135a of the pressing plate 135 is located slightly higher than the substrate contact surfaces 61a of the scrubbing members 61. The soft pad 137 may be made of PVA sponge, nonwoven fabric, or the like.

Figure 22:
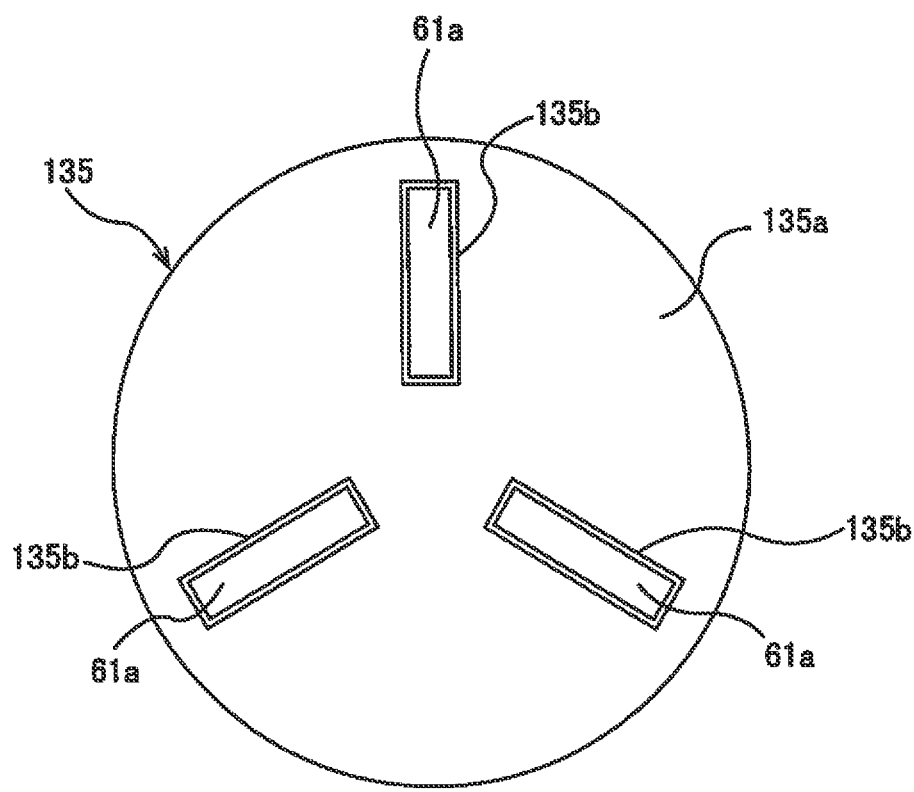
FIG. 22 is a bottom view of a pressing plate.

FIG. 22 is a bottom view of the pressing plate 135. The pressing plate 135 has a plurality of through-holes 135b defined therein which are slightly larger than the substrate contact surfaces 61a of the scrubbing members 61. The scrubbing members 61 are located in the corresponding through-holes 135b. The substrate contact surface 135a of the pressing plate 135 may preferably be of a circular shape having a diameter larger than the diameter of the scrubbing surface that is constituted by the substrate contact surfaces 61a of the rotating scrubbing members 61.

During the scrubbing process, the substrate W is subjected to the fluid pressure from the hydrostatic support structure 90. As a result, portions of the substrate W which are not in contact with the scrubbing members 61 may be bent under the fluid pressure. The pressing plate 135 is capable of preventing the substrate W from being bent. Specifically, the pressing plate 135 contacts the upper surface of the substrate W at the same time the scrubbing members 61 contact the upper surface of the substrate W, and presses the portions of the substrate W which are not in contact with the scrubbing members 61, thereby preventing the substrate W from being bent. As a result, the scrubbing members 61 can process the surface of the substrate W uniformly.

Figure 23:
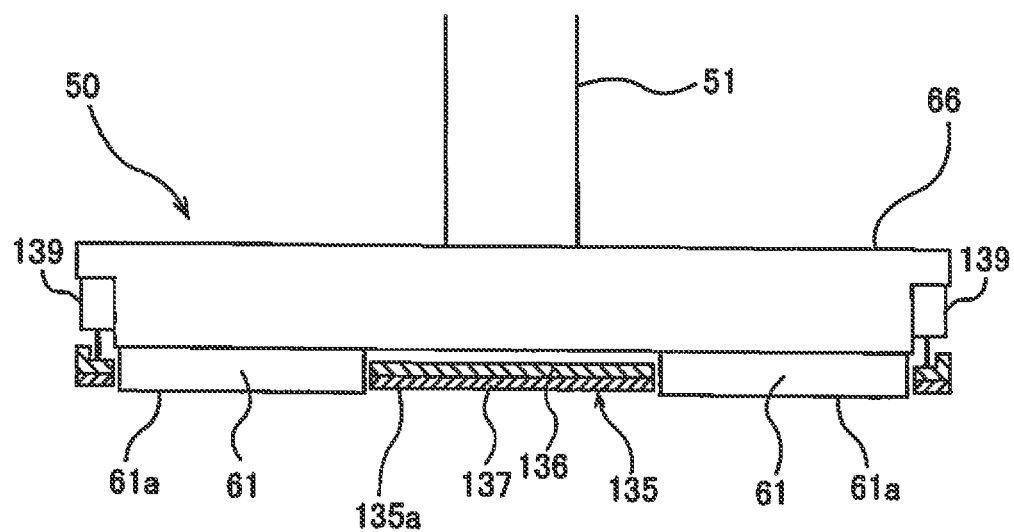
FIG. 23 is a view showing a scrubber having relatively moving devices for vertically moving the pressing plate.

As shown in FIG. 23, the scrubber 50 may further have relatively moving devices 139 for moving the pressing plate 135 relative to the scrubbing members 61. The relatively moving devices 139, which are mounted to the holder 66, move the pressing plate 135 in directions toward and away from the upper surface of the substrate W. Each of the relatively moving devices 139 may be an air cylinder, a combination of a ball screw mechanism and a servomotor, or the like.

Figure 24:
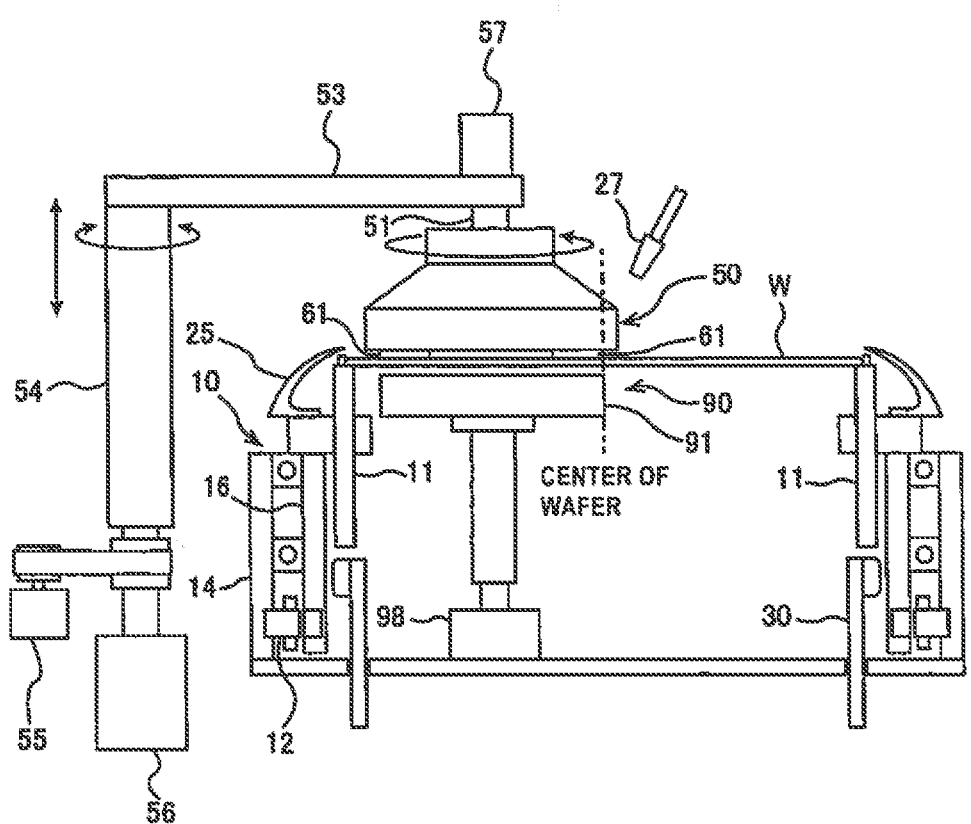
FIG. 24 is a view showing a more detailed structure of the substrate processing apparatus.

Next, more detailed structures of the substrate processing apparatus will be described. The structures of the substrate processing apparatus, which will be described below, can be applied to the above-discussed embodiments. As shown in FIG. 24, the substrate rotating mechanism 10 includes the plurality of chucks 11 for holding the peripheral edge of the substrate W and the hollow motor 12 for rotating the substrate W through the chucks 11. The substrate rotating mechanism 10 has a cylindrical shape as a whole having an interior space defined centrally. If the substrate rotating mechanism 10 does not have such a large space underneath the substrate W, negative pressure may be produced below the substrate W when the substrate W is rotated at a high speed. Such negative pressure is likely to attract dusts and particles suspended in the air, which may be attached to the lower surface of the substrate W. In this embodiment, since the hollow motor 12 is used, the substrate rotating mechanism 10 can be of the cylindrical shape forming the large interior space below the substrate W and can therefore prevent such a problem. In addition, the hydrostatic support structure 90 can be disposed in the interior space of the substrate rotating mechanism 10.

Figure 25:
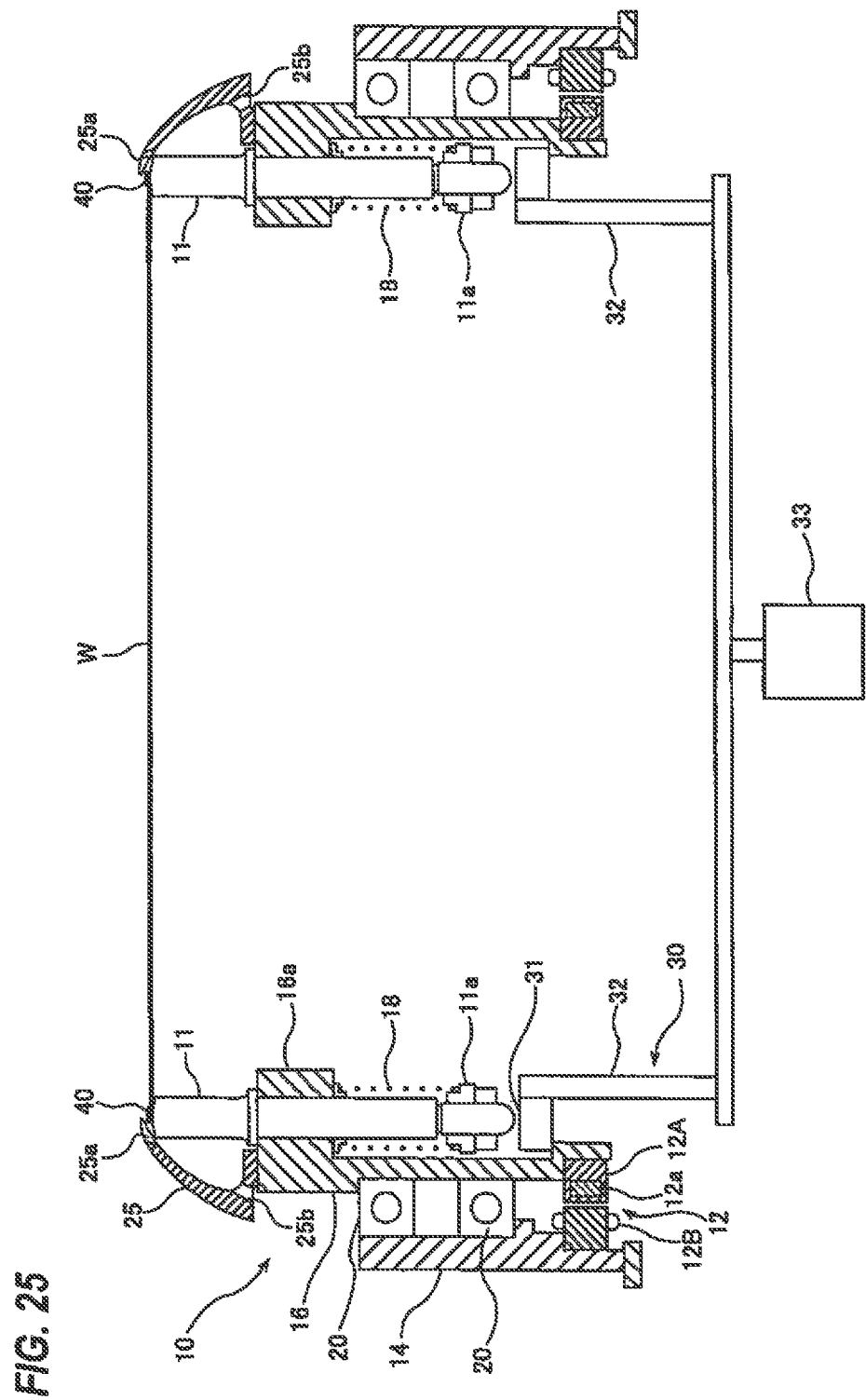
FIG. 25 is a cross-sectional view showing a detailed structure of a substrate rotating mechanism.

FIG. 25 is a cross-sectional view showing a detailed structure of the substrate rotating mechanism 10. As shown in FIG. 25, the hollow motor 12 is shaped so as to have a space formed in the center thereof. The hollow motor 12 has a cylindrical rotor 12A and a stator 12B disposed so as to surround the rotor 12A. The rotor 12A has an inner circumferential surface having a diameter larger than that of the substrate W. Use of such hollow motor 12 allows the substrate rotating mechanism 10 to have the cylindrical shape with the large interior space at the center thereof. The rotor 12A includes a plurality of permanent magnets 12a embedded therein. The hollow motor 12 is a sensorless IPM (Interior Permanent Magnet) motor with no optical position sensor. The hollow motor 12 of this type can be manufactured at low costs. Moreover, even if a liquid enters the hollow motor 12, malfunction due to failure of the position sensor is not likely to occur.

The stator 12B is fixed to a cylindrical stationary member 14. A cylindrical rotary base 16 is disposed radially inwardly of the stationary member 14. The rotary base 16 is rotatably supported by a combination of angular contact ball bearings 20 disposed between the stationary member 14 and the rotary base 16. These two angular contact ball bearings 20 are capable of bearing both a radial load and an axial load. Other types of bearings may be used so long as they can support both a radial load and an axial load. The stator 12B of the hollow motor 12 is secured to the stationary member 14. The rotor 12A of the hollow motor 12 is secured to the rotary base 16, so that the rotor 12A and the rotary base 16 can rotate in unison with each other.

The chucks 11 are mounted to an upper portion of the rotary base 16 such that the chucks 11 are vertically movable. More specifically, the upper portion of the rotary base 16 has an annular flange 16a projecting radially inward. The annular flange 16a has a plurality of vertical through-holes in which the chucks 11 are inserted, respectively. Springs 18 are disposed around lower portions of the chucks 11, respectively. These springs 18 have upper ends pushing the lower surface of the flange 16a upwardly and lower ends contacting spring stoppers 11a, which are mounted to respective lower ends of the chucks 11. The chucks 11 are forced downward by the respective springs 18. The chucks 11 are rotatable in unison with the rotary base 16 by the hollow motor 12.

Figure 26:
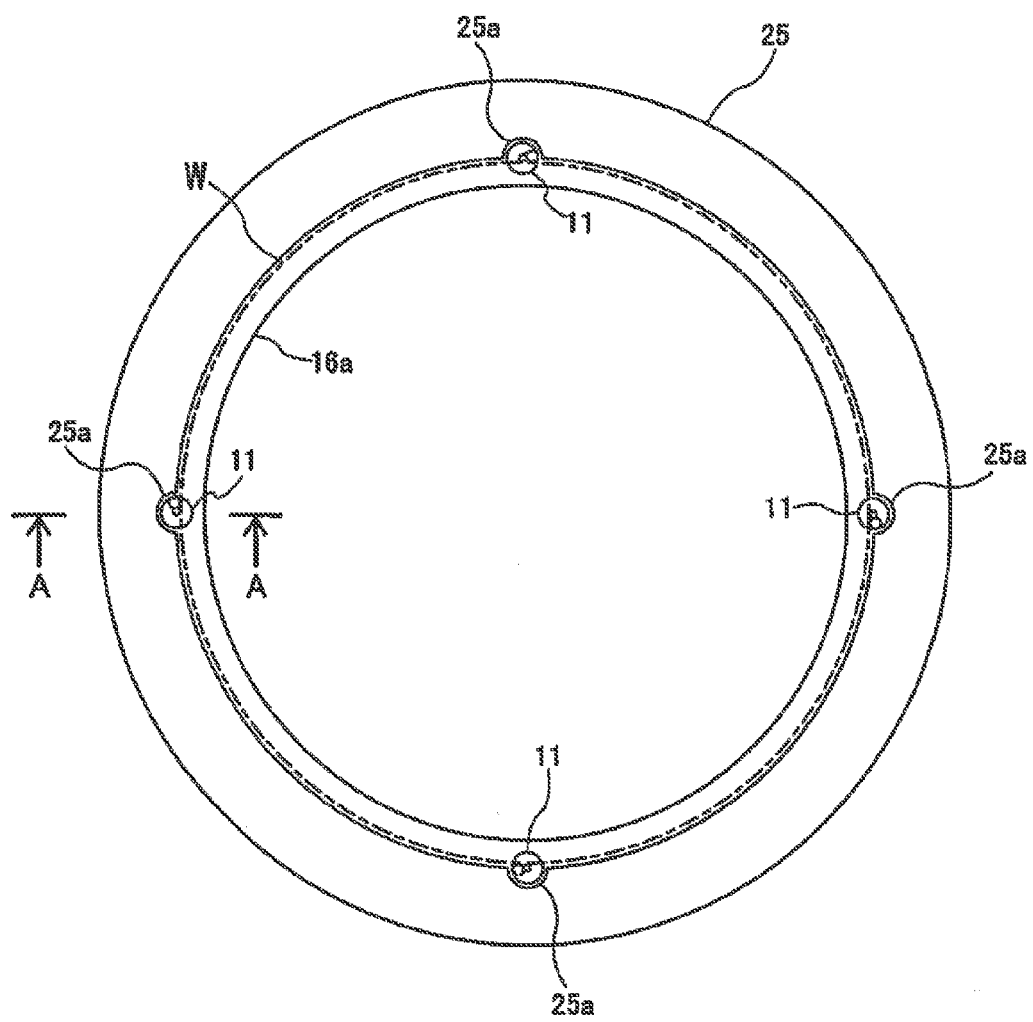
FIG. 26 is a view showing a rotary cover and chucks as viewed from above.

An annular spin cover (or spin cup) 25 is disposed radially outwardly of the chucks 11 so as to surround the substrate W held by the chucks 11. The spin cover 25 is secured to an upper surface of the rotary base 16, so that the spin cover 25 can rotate in unison with the substrate W. FIG. 26 is a plan view of the spin cover 25 and the chucks 11. As shown in FIG. 26, the spin cover 25 is shaped so as to surround the circumference of the substrate W in its entirety. The spin cover 25 has an upper end whose inside diameter is slightly larger than the diameter of the substrate W. The upper end of the spin cover 25 has a plurality of cutout portions 25a at positions corresponding to those of the chucks 11. Each cutout portion 25a is shaped so as to extend along the circumferential surface of each chuck 11.

As shown in FIG. 25, the spin cover 25 has an inner circumferential surface having a vertical cross-sectional shape inclined radially inward and defined by a smooth curved line. The upper end of the spin cover 25 is located close to the substrate W. The spin cover 25 has oblique liquid drain holes 25b defined in a lower portion thereof.

As shown in FIG. 24, the cleaning liquid supply nozzle 27 for supplying pure water as the cleaning liquid onto the upper surface of the substrate W is disposed above the substrate W. The cleaning liquid supply nozzle 27 is coupled to the cleaning liquid source (not shown), so that the pure water is supplied onto the upper surface of the substrate W through the cleaning liquid supply nozzle 27. When the substrate W is rotated about its own axis by the substrate rotating mechanism 10, the pure water, supplied to the substrate W, is expelled off the substrate W under centrifugal force. Further, the pure water is captured by the inner circumferential surface of the spin cover 25 and flows into the liquid drain holes 25b.

Figure 27:
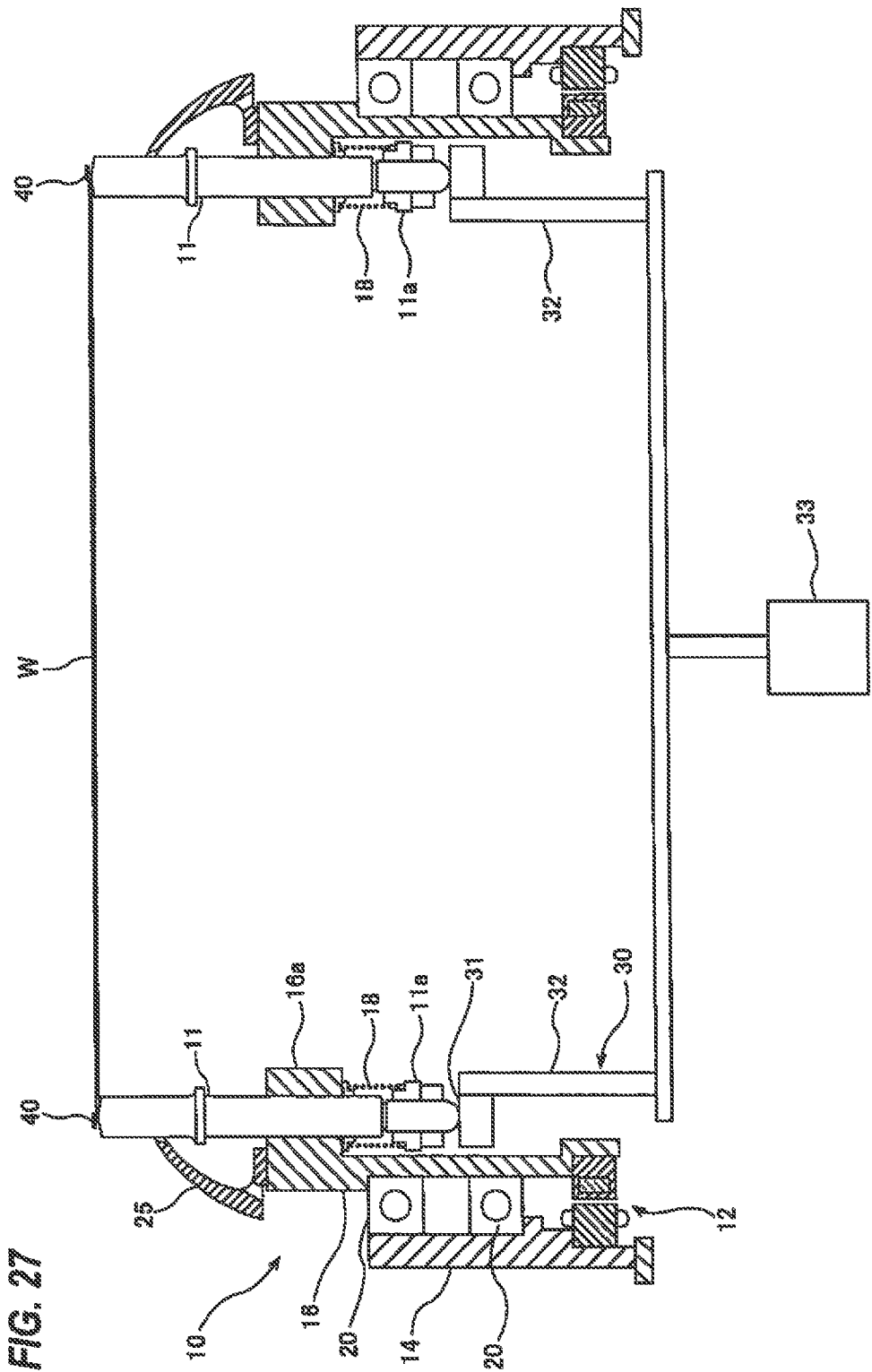
FIG. 27 is a view showing the manner in which an air cylinder elevates a ring stage through a plurality of rods.

A lift mechanism 30 for elevating the chucks 11 is disposed below the chucks 11. The lift mechanism 30 includes a ring stage 31 disposed below the chucks 11, a plurality of rods 32 supporting the ring stage 31, and an air cylinder 33 as an actuator for elevating the rods 32. The lift mechanism 30, which is separated from the rotary base 16, is not rotatable. As shown in FIG. 27, the air cylinder 33 is configured to elevate the ring stage 31 through the rods 32. The upward movement of the ring stage 31 moves the chucks 11 upwardly simultaneously. When the operation of the air cylinder 33 is stopped, the chucks 11 are lowered by the springs 18 mounted to the chucks 11. FIG. 25 shows a state in which the chucks 11 are in a lowered position. The lift mechanism 30 and the springs 18 constitute a vertically moving mechanism for vertically moving the chucks 11.

Although not shown, instead of the air cylinders 33, a plurality of electric cylinders capable of elevating the respective chucks 11 simultaneously may be provided. For example, four electric cylinders are provided for the four chucks 11, respectively. In the case of using the electric cylinders, the ring stage 31 is not provided. When the rotation of the substrate W stops, the chucks 11 are controlled so as to stop at positions above the respective electric cylinders. Operations of the electric cylinders are controlled by a common driver so that the electric cylinders operate in synchronism.

Clamps 40 for holding the peripheral edge of the substrate W are mounted respectively to the upper ends of the chucks 11. When the chucks 11 are in the lowered position shown in FIG. 25, the clamps 40 are in contact with the peripheral edge of the substrate W to thereby hold the peripheral edge. When the chucks 11 are in the elevated position shown in FIG. 27, the clamps 40 are separated from the peripheral edge of the substrate W to release the peripheral edge.

As shown in FIG. 24, the scrubber 50 is disposed at the upper side of the substrate W. The scrubber 50 is coupled to one end of a swing arm 53 through the scrubber shaft 51. The other end of the swing arm 53 is fixed to a pivot shaft 54, which is coupled to a shaft rotating mechanism 55. This shaft rotating mechanism 55 is configured to rotate the pivot shaft 54 such that the scrubber 50 moves between a processing position shown in FIG. 24 and a retreat position located radially outwardly of the substrate W. The pivot shaft 54 is further coupled to a scrubber elevating mechanism 56 which moves the scrubber 50 vertically. This scrubber elevating mechanism 56 is configured to elevate and lower the scrubber 50 through the pivot shaft 54 and the scrubber shaft 51. The scrubber 50 is lowered to contact the upper surface of the substrate W by the scrubber elevating mechanism 56. The scrubber elevating mechanism 56 may include an air cylinder or a combination of a servomotor and a ball screw.

Figure 28:
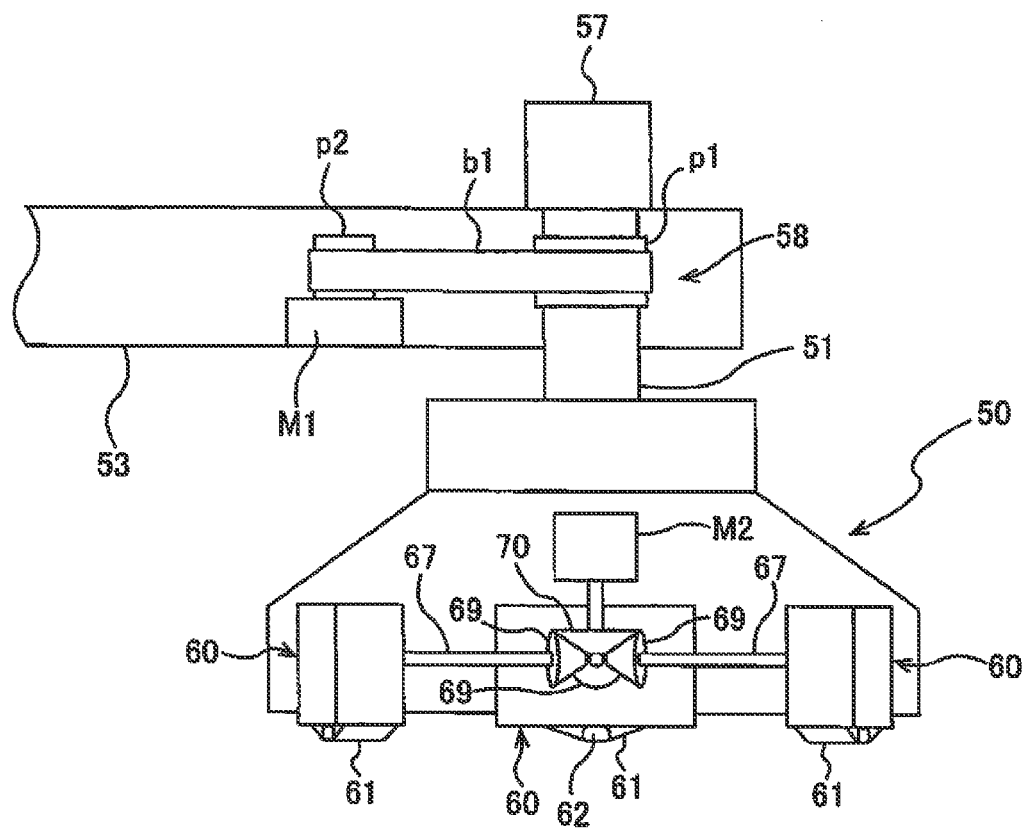
FIG. 28 is a view showing an internal structure of a scrubber and a swing arm.

FIG. 28 is a view showing internal structures of the scrubber 50 and the swing arm 53. As shown in FIG. 28, a scrubber rotating mechanism 58 is provided in the swing arm 53. This scrubber rotating mechanism 58 is configured to rotate the scrubber 50 about its central axis. More specifically, the scrubber rotating mechanism 58 includes a pulley p1 fixed coaxially to the scrubber shaft 51, a motor M1 mounted to the swing arm 53, a pulley p2 fixed coaxially to a rotational shaft of the motor M1, and a belt b1 riding on the pulleys p1, p2. Rotation of the motor M1 is transmitted through the pulleys p1, p2 and the belt b1 to the scrubber shaft 51, which rotates the scrubber 50.

The air cylinder 57 is coupled to the upper end of the scrubber shaft 51. This air cylinder 57 is configured to exert a downward load on the scrubbing members 61 of the scrubber 50. The scrubber shaft 51 has vertically-extending grooves (not shown) formed on a surface thereof, and the pulley p1 has load-transmission balls (not shown) which engage with the grooves of the scrubber shaft 51. These grooves and the load-transmission balls constitute a ball spline bearing. Therefore, the pulley p1 can transmit a torque to the scrubber shaft 51 while allowing the scrubber shaft 51 to move in the vertical direction.

Figure 29:
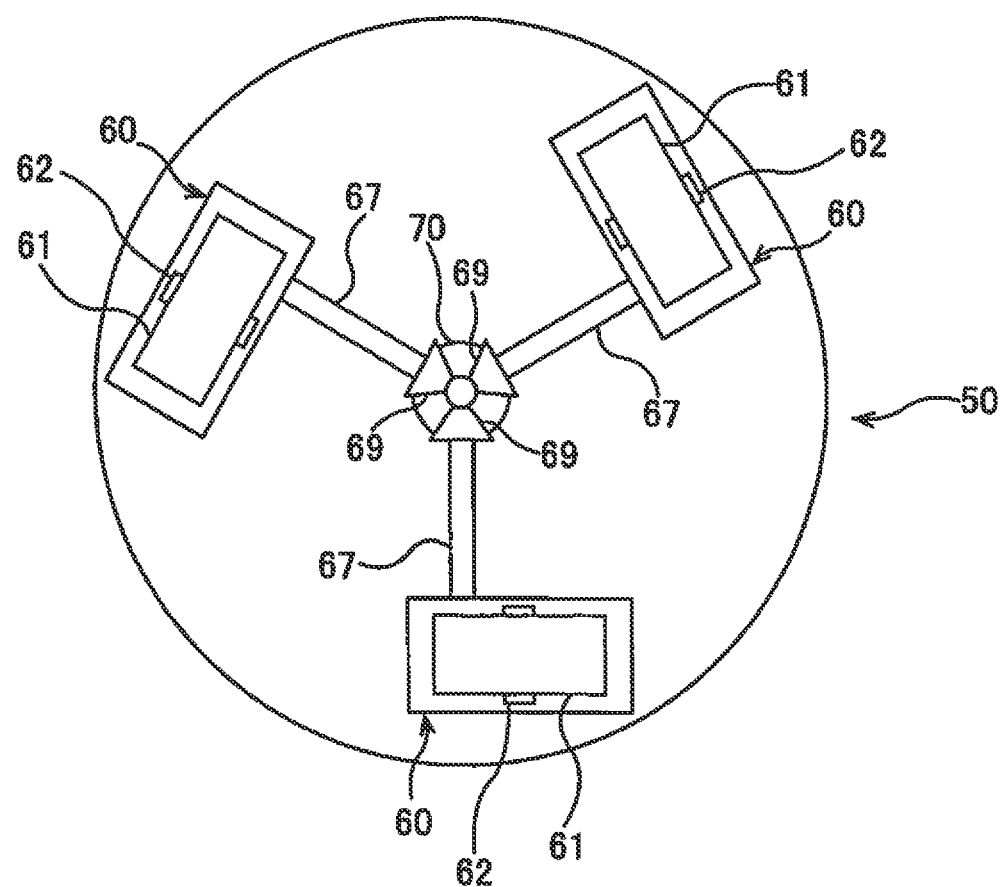
FIG. 29 is a view showing the scrubber as viewed from below.

FIG. 29 is a bottom view of the scrubber 50. The scrubber 50 has a lower surface that provides the circular scrubbing surface for scrubbing the upper surface of the substrate W (the front-side surface or the backside surface of the substrate W) that is held by the substrate rotating mechanism 10. The scrubber 50 has a plurality of (three in FIG. 29) cleaning tapes 61 as the scrubbing members arranged so as to face the upper surface of the substrate W. The scrubber 50 has a plurality of (three in FIG. 29) tape cartridges 60 accommodating the cleaning tapes 61 therein, respectively. The tape cartridges 60 are removably installed in the scrubber 50.

When scrubbing the substrate W, the scrubber 50 is rotated about its central axis by the scrubber rotating mechanism 58 to rotate the cleaning tapes 61 about the central axis of the scrubber 50, so that the cleaning tapes 61 are placed in sliding contact with the upper surface of the substrate W. The scrubbing surface of the scrubber 50 is formed by the rotating cleaning tapes 61. Since the lower surface of the substrate W is supported by the fluid pressure, the scrubber 50 can press the cleaning tapes 61 against the upper surface of the substrate W with a large load without bending the substrate W. Material forming the upper surface of the substrate W is scraped off slightly by the sliding contact with the cleaning tapes 61. Therefore, the foreign matters, attached to the substrate W, and the surface scratches of the substrate W can be removed. An amount (or a thickness) of the material scraped off the substrate W by the scrubber 50 may be 50 nm or less. The surface of the substrate W that has been scrubbed may have a surface roughness of 5 µm or less. In this manner, by slightly scrapping away the surface of the substrate W, the foreign matters stuck firmly into the substrate W and having a diameter of 100 nm or larger can be completely removed from the substrate W.

Figure 30:
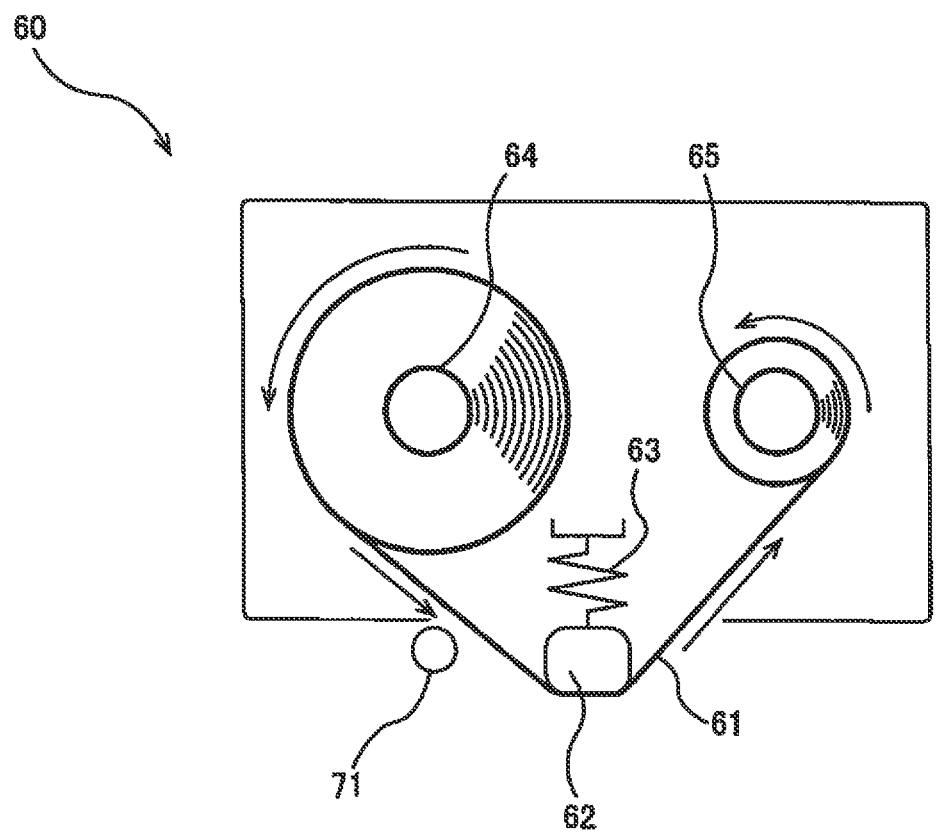
FIG. 30 is a cross-sectional view of a tape cartridge of the scrubber.

FIG. 30 is a cross-sectional view of the tape cartridge 60 disposed in the scrubber 50. As shown in FIG. 30, the tape cartridge 60 includes the cleaning tape 61, a pressing member 62 for pressing the cleaning tape 61 against the substrate W, a biasing device 63 for biasing the pressing member 62 toward the substrate W, a tape feeding reel 64 for feeding the cleaning tape 61, and a tape take-up reel 65 for taking up the cleaning tape 61 that has been used in the scrubbing process. The cleaning tape 61 is advanced from the tape feeding reel 64 to the tape take-up reel 65 via the pressing member 62. The pressing members 62 of the respective tape cartridges 60 extend in the radial direction of the scrubber 50 and are arranged at equal intervals in a circumferential direction of the scrubber 50. Therefore, the cleaning tapes 61 have respective wafer contact surfaces (i.e., substrate contact surfaces) extending in the radial direction of the scrubber 50. In FIG. 30, a spring is used as the biasing device 63.

The tape take-up reels 65 of the tape cartridges 60 are coupled to one ends of tape take-up shafts 67 as shown in FIGS. 28 and 29. Bevel gears 69 are secured to the other ends of the tape take-up shafts 67, respectively. These bevel gears 69, which are coupled to the tape cartridges 60, are in mesh with a bevel gear 70 which is coupled to a rotational shaft of a motor M2 arranged in the scrubber 50. With these configurations, the tape take-up reels 65 are driven by the motor M2 to take up (or collect) the cleaning tapes 61. The motor M2, the bevel gears 69 and 70, and the tape take-up shafts 67 jointly construct a tape advancing mechanism for advancing the cleaning tapes 61 from the tape feeding reels 64 to the tape take-up reels 65.

Each cleaning tape 61 has a width ranging from 10 mm to 60 mm and a length ranging from 20 m to 100 m. The cleaning tape 61 may be made of nonwoven fabric, woven fabric, or knitted fabric. Nonwoven fabric harder than PVA sponge may be used as the cleaning tape 61. The cleaning tape 61 made of such nonwoven fabric can remove the foreign matters on the substrate W, particularly the foreign matters stuck into the surface of the substrate W. Instead of the cleaning tape 61, a polishing tape having on its one-side surface a polishing layer containing abrasive grains may be used as the scrubbing member.

When the substrate W is scrubbed, the cleaning tape 61 is advanced at a predetermined speed from the tape feeding reel 64 to the tape take-up reel 65. Therefore, a new (i.e., unused) surface of the cleaning tape 61 is brought into contact with the substrate W at all times. Each cleaning tape 61 has an end mark (not shown) near the terminal end thereof. This end mark is detected by an end-mark detection sensor 71 which is disposed in proximity to the cleaning tape 61. When the end-mark detection sensor 71 detects the end mark on the cleaning tape 61, the end-mark detection sensor 71 sends a detection signal to an operation controller (not shown). Upon receiving the detection signal, the operation controller produces a signal, such as an alarm signal, for prompting a user to replace the cleaning tape 61 with new one. Since the tape cartridges 60 are removable, they can easily be replaced with new tape cartridges 60.

The retreat position of the scrubber 50 is located radially outwardly of the substrate rotating mechanism 10, and the scrubber 50 is configured to be movable between the retreat position and the processing position. A both (not shown) retaining pure water therein is provided in the retreat position of the scrubber 50. When the scrubber 50 is in the retreat position, the lower surface (i.e., the scrubbing surface) of the scrubber 50 is immersed into the pure water in the bath in order to prevent the cleaning tapes 61 from being dried. The pure water in the bath is replaced with fresh pure water each time the scrubber 50 performs surface processing of the substrate W, so that the bath contains clean pure water at all times.

Next, operations of the substrate processing apparatus according to the above-described embodiment will be described below. The scrubber 50 is moved to the retreat position outside of the substrate rotating mechanism 10. In this state, the substrate W is transported to a position above the substrate rotating mechanism 10 by a non-illustrated transfer device. The lift mechanism 30 elevates the chucks 11 and the substrate W is placed on the upper ends of the chucks 11. When the chucks 11 are lowered, the substrate W is held by the clamps 40 of the chucks 11. The substrate W is held such that the surface with no device faces upward and the surface with devices formed thereon faces downward. Depending on the purpose of substrate processing, the substrate W may be held by the substrate rotating mechanism 10 such that the surface with devices formed thereon faces upward and the surface with no device faces downward.

The scrubber 50 is moved from the retreat position to the processing position. The substrate W is rotated at a predetermined speed by the substrate rotating mechanism 10. A rotational speed of the substrate W when the scrubber 50 is performing substrate processing may be in the range of 300 to 600 rotations per minute. The support stage 91 is elevated by the stage elevating device 98 until the substrate support surface 91*a* is located close to the lower surface of the substrate W. Then, the fluid, which may be pure water, is continuously supplied into the fluid discharge ports 94 to support the substrate W via the fluid pressure.

The scrubber 50 is rotated by the scrubber rotating mechanism 58, and lowered by the scrubber elevating mechanism 56 until the cleaning tapes 61 are located close to the upper surface of the substrate W. Further, the cleaning tapes 61 are pressed against the upper surface of the substrate W by the air cylinder 57. The scrubber 50 and the substrate W are rotated in the same direction. The upper surface of the substrate W is processed by the scrubbing surface formed by the cleaning tapes 61 that rotate about the central axis of the scrubber 50, while the pure water as the processing liquid is supplied onto the upper surface of the substrate W from the cleaning liquid supply nozzle 27. The processing liquid may be a polishing liquid containing abrasive grains, instead of the pure water. The cleaning tapes 61 may be cleaning tapes having abrasive grains fixed to their surfaces. Without using the processing liquid, the cleaning tapes 61 in a dry state may be placed in sliding contact with the substrate W.

During the scrubbing process, the substrate W is supported from below by the hydrostatic support structure 90. In this state, the scrubber 50 brings the cleaning tapes 61 into sliding contact with the upper surface of the substrate W while rotating the cleaning tapes 61 about the central axis of the scrubber 50 to thereby remove the foreign matters deposited on the upper surface of the substrate W and the scratches on the upper surface of the substrate W. Since the substrate W is supported by the hydrostatic support structure 90, the scrubber 50 can bring the cleaning tapes 61 into sliding contact with the upper surface of the substrate W at a large load. Accordingly, the scrubber 50 can remove relatively large foreign matters and foreign matters firmly stuck into the surface of the substrate W which could not be removed by a conventional cleaning apparatus.

After the scrubbing process of the substrate W is finished, the scrubber 50 is moved to the retreat position, and the supply of the fluid to the support stage 91 is stopped. The support stage 91 is then lowered by the stage elevating device 98 to a predetermined position. After the support stage 91 is lowered, the pure water as the cleaning liquid is supplied to the upper surface of the substrate W from the cleaning liquid supply nozzle 27 while the substrate W is rotated to wash away the debris produced in the scrubbing process.

The substrate W that has been cleaned is then rotated at a high speed by the substrate rotating mechanism 10, so that the substrate W is spin-dried. In this spin-dry process, the substrate W is rotated at a speed in the range of 1500 to 3000 rotations per min. Since no rotating element exists below the substrate W when being dried on the hollow substrate rotating mechanism 10, watermarks due to droplets and attachment of the foreign matters can be prevented. After the substrate W is dried, the chucks 11 are elevated by the lift mechanism 30, releasing the substrate W therefrom. The substrate W is removed from the substrate processing apparatus by the transfer device (not shown). In this manner, the substrate processing apparatus according to the embodiment is capable of successively scrubbing, cleaning or rinsing, and drying the substrate W while holding the substrate W by the substrate rotating mechanism 10. Therefore, attachment of the foreign matters to the substrate W when transported and diffusion of contaminations from the wet substrate W to a transfer path can be prevented. Moreover, a process take time can be reduced.

Figure 31A:
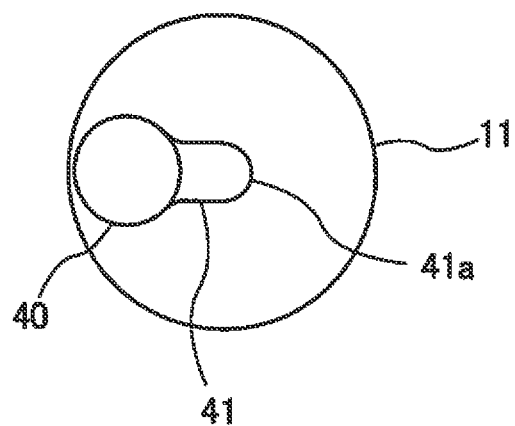
FIG. 31A is a plan view of a clamp of a chuck.
Figure 31B:
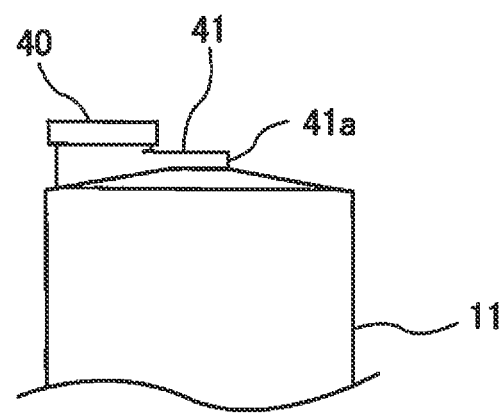
FIG. 31B is a side view of the clamp.

Structural details of the substrate rotating mechanism 10 will be described below. FIG. 31A is a plan view showing the clamp 40 of the chuck 11, and FIG. 31B is a side view of the clamp 40. As shown in FIGS. 31A and 31B, the clamp 40 is formed at the upper end of the chuck 11. This clamp 40 has a circular or cylindrical horizontal cross section and is arranged so as to contact the peripheral edge of the substrate W to thereby hold the substrate W. The chuck 11 has a positioning portion 41 extending from the clamp 40 to the central axis of the chuck 11. One end of the positioning portion 41 is connected integrally to a side surface of the clamp 40 and the other end is located on the central axis of the chuck 11. This center-side end of the positioning portion 41 has a curved side surface 41*a* extending along a circle which is concentric with the chuck 11. The upper end of the chuck 11 has a tapered surface inclined downwardly along the radially outward direction.

Figure 32A:
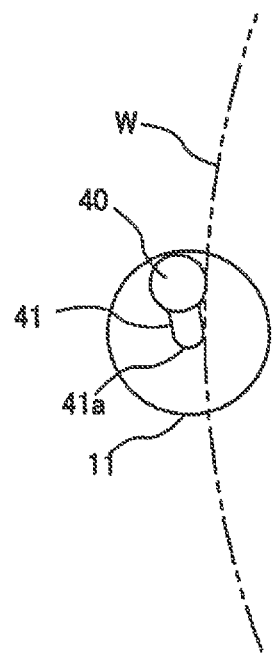
FIG. 32A is a plan view showing the clamp when gripping the substrate.
Figure 32B:
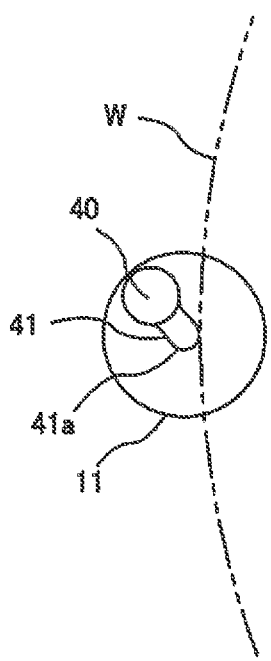
FIG. 32B is a plan view showing the clamp when releasing the substrate.

FIG. 32A is a plan view of the clamp 40 when holding the substrate W, and FIG. 32B is a plan view of the clamp 40 when releasing the substrate W. The substrate W is placed on the upper end (the tapered surface) of each chuck 11. When the chuck 11 is rotated in one direction, the clamp 40 is brought into contact with the peripheral edge of the substrate W to thereby hold the substrate W, as shown in FIG. 32A. When the chuck 11 is rotated in the opposite direction, the clamp 40 is separated from the substrate W to thereby release the substrate W, as shown in FIG. 32B. At this time, the peripheral edge of the substrate W is placed in contact with the curved side surface 41*a* of the center-side end of the positioning portion 41. This curved side surface 41*a* of the positioning portion 41 can restrict a displacement of the substrate W which occurs when the chuck 11 rotates. As a result, subsequent wafer transferring operations can be performed stably.

Figure 33A:
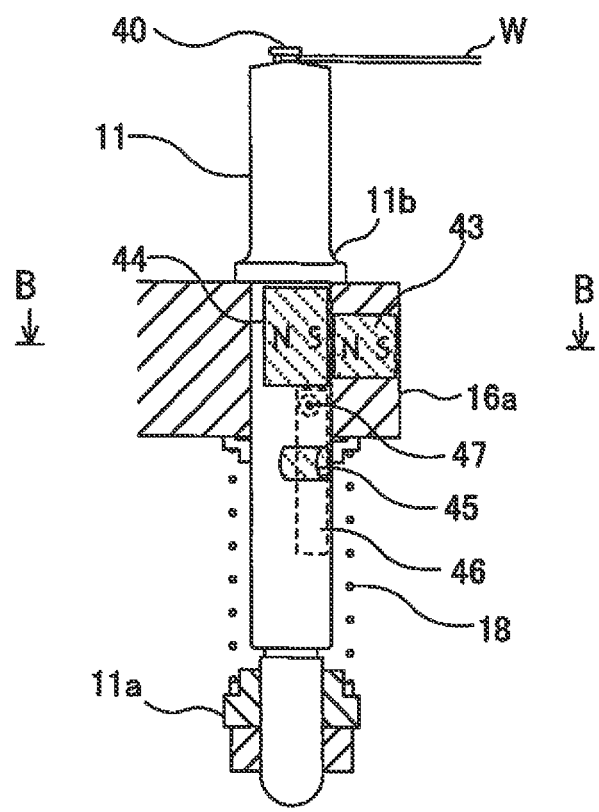
FIG. 33A is a cross-sectional view taken along line A-A of FIG. 26.
Figure 33B:
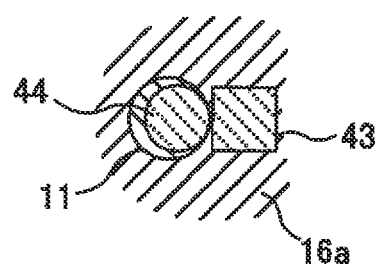
FIG. 33B is a cross-sectional view taken along line B-B of FIG. 33A.

FIG. 33A is a cross-sectional view taken along line A-A in FIG. 26, and FIG. 33B is a cross-sectional view taken along line B-B in FIG. 33A. The annular flange 16*a* of the rotary base 16 has a plurality of vertical through-holes in which the chucks 11 are inserted, respectively. Each through-hole has a diameter slightly larger than the diameter of the chuck 11. Therefore, the chuck 11 inserted in the through-hole is vertically movable relative to the rotary base 16 and is rotatable about its central axis.

The spring stopper 11*a* is secured to the lower end of each chuck 11. The spring 18, disposed around the chuck 11, is supported by the spring stopper 11*a*. The upper end of the spring 18 presses the flange 16*a* of the rotary base 16 upwardly. Therefore, the spring 18 exerts a downward force on the chuck 11. The chuck 11 has a chuck stopper 11b on the circumferential surface thereof above the rotary base 16. This chuck stopper 11b has a diameter larger than the diameter of the through-hole in the flange 16a. Therefore, a downward movement of the chuck 11 is limited by the chuck stopper 11b, as shown in FIG. 33A.

A first magnet 43 is embedded in the rotary base 16 so as to face a side surface of the chuck 11. A second magnet 44 and a third magnet 45 are provided in the chuck 11. The second magnet 44 and the third magnet 45 are arranged away from each other in the vertical direction. The first, second, and third magnets 43, 44, and 45 may be neodymium magnets.

Figure 34:
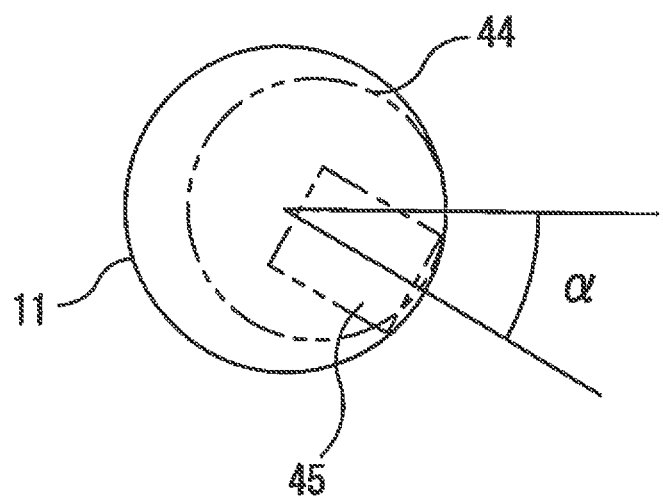
FIG. 34 is a schematic view showing a layout of a second magnet and a third magnet as viewed along an axial direction of the chuck.

FIG. 34 is a schematic view showing the arrangement of the second magnet 44 and the third magnet 45, as viewed from the axial direction of the chuck 11. As shown in FIG. 34, the second magnet 44 and the third magnet 45 are arranged in different positions with respect to the circumferential direction of the chuck 11. Specifically, a line interconnecting the center of the second magnet 44 and the center of the chuck 11 and a line interconnecting the center of the third magnet 45 and the center of the chuck 11 intersect at a predetermined angle α as viewed from the axial direction of the chuck 11.

When the chuck 11 is in the lowered position shown in FIG. 33A, the first magnet 43 and the second magnet 44 face each other. As a result, an attractive force acts between the first magnet 43 and the second magnet 44. This attractive force generates a force of rotating the chuck 11 about its central axis in a direction such that the clamp 40 presses the peripheral edge of the substrate W. Accordingly, the lowered position shown in FIG. 33A is a clamp position at which the substrate W is held (clamped).

Figure 35A:
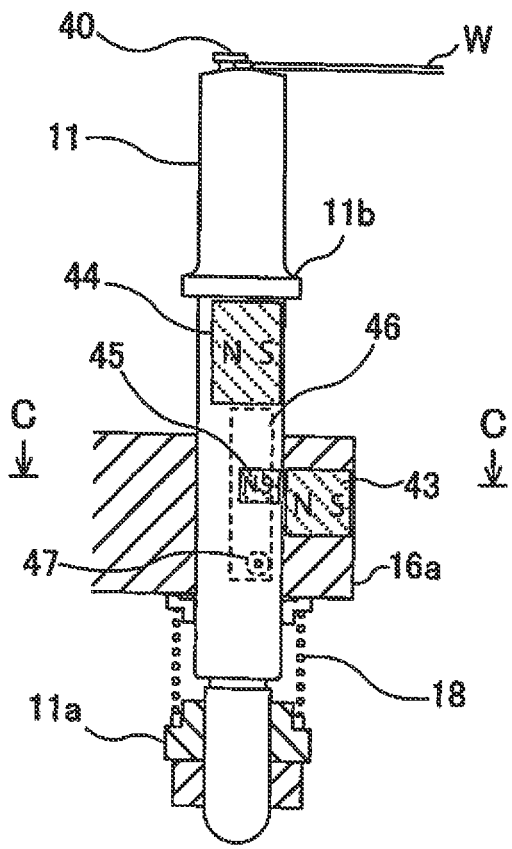
FIG. 35A is a cross-sectional view taken along line A-A of FIG. 26, showing the chuck elevated by a lifting mechanism.
Figure 35B:
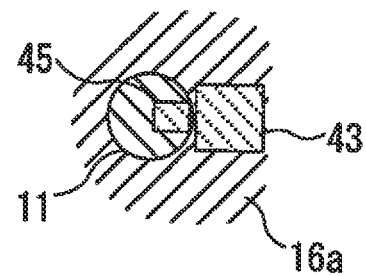
FIG. 35B is a cross-sectional view taken along line C-C of FIG. 35A.

FIG. 35A is a cross-sectional view taken along the line A-A in FIG. 26 when the chuck 11 is elevated by the lift mechanism 30, and FIG. 35B is a cross-sectional view taken along line C-C in FIG. 35A. When the chuck 11 is elevated by the lift mechanism 30 to the elevated position shown in FIG. 35A, the first magnet 43 and the third magnet 45 face each other, while the second magnet 44 is moved away from the first magnet 43. As a result, an attractive force acts between the first magnet 43 and the third magnet 45. This attractive force generates a force of rotating the chuck 11 about its central axis in a direction such that the clamp 40 moves away from the substrate W. Accordingly, the elevated position shown in FIG. 35A is an unclamp position at which the substrate W is released (unclamped).

Because the second magnet 44 and the third magnet 45 are arranged in different positions with respect to the circumferential direction of the chuck 11, the rotating force acts on the chuck 11 as the chuck 11 moves up and down. This rotating force imparts a force of holding the substrate W and a force of releasing the substrate W to the clamp 40. Therefore, by just moving the chuck 11 vertically, the clamp 40 can hold and release the substrate W. In this manner, the first magnet 43, the second magnet 44, and the third magnet 45 function as a holding mechanism (clamp mechanism) for holding the substrate W by rotating the chuck 11 about its central axis to cause the clamp 40 to hold the substrate W. This holding mechanism is actuated by the vertical movement of the chuck 11.

The chuck 11 has an axially extending groove 46 formed on a side surface thereof. The groove 46 has a circular arc horizontal cross-sectional shape. The flange 16a of the rotary base 16 has a protrusion 47 projecting into the groove 46. This protrusion 47 has its tip end located within the groove 46 and loosely engaging the groove 46. The groove 46 and the protrusion 47 serve to limit the rotation angle of the chuck 11.

In the embodiments described thus far, the scrubber 50 is disposed at the upper side of the substrate W, while the hydrostatic support structure 90 is disposed at the lower side of the substrate W. In another embodiment, the scrubber 50 may be disposed at the lower side of the substrate W, while the hydrostatic support structure 90 may be disposed at the upper side of the substrate W.

The substrate to be processed may be a device wafer, a glass substrate, or the like. According to the above-described embodiments, the substrate can be processed without being bent, because the substrate is supported by the fluid pressure. Therefore, substrates having various sizes can be processed. For example, wafers having diameters of 100 mm, 150 mm, 200 mm, 300 mm, and 450 mm can be processed. Glass substrates having large sizes can also be processed.

Although the preferred embodiments of the present invention have been described above, it should be understood that the present invention is not limited to the above embodiments, but various changes and modifications may be made to the embodiments without departing from the scope of the appended claims.

What is claimed is:

1. A substrate processing apparatus for processing a substrate having a first surface and a second surface, the second surface being an opposite surface of the first surface, the substrate processing apparatus comprising:
   a scrubber configured to place at least one scrubbing member in sliding contact with the first surface of the substrate to process the first surface, the scrubber having a plurality of deformable elastic members supporting the at least one scrubbing member, the plurality of elastic members having top surfaces, respectively, which are spaced from each other; and
   a hydrostatic support structure configured to support the second surface of the substrate via fluid without contacting the substrate.

2. The substrate processing apparatus according to claim 1, wherein the scrubber has a hard member which is harder than the plurality of elastic members, and the plurality of elastic members are fixed to the hard member.

3. The substrate processing apparatus according to claim 1, wherein the scrubber has a hard member which is harder than the plurality of elastic members, and the hard member is disposed between the plurality of elastic members and the at least one scrubbing member.

4. The substrate processing apparatus according to claim 1, wherein the plurality of elastic members comprise a plurality of air bags filled with a gas.

5. The substrate processing apparatus according to claim 1, wherein the at least one scrubbing member comprises a plurality of scrubbing members, and each one of the plurality of scrubbing members is supported by at least two of the plurality of elastic members.

6. The substrate processing apparatus according to claim 1, wherein the plurality of elastic members are spaced from each other with a gap larger than a thickness of the plurality of elastic members.

7. The substrate processing apparatus according to claim 1, wherein the scrubber has at least one hard member which is harder than the plurality of elastic members, and the top surfaces are fixed to the at least one hard member.

8. The substrate processing apparatus according to claim 1, wherein the scrubber has a holder and the top surfaces are fixed to the holder.

* * * * *